(12) United States Patent
Iida et al.

(10) Patent No.: US 7,893,525 B2
(45) Date of Patent: Feb. 22, 2011

(54) SEMICONDUCTOR DEVICE HAVING AN ADHESIVE PORTION WITH A STACKED STRUCTURE AND METHOD FOR MANUFACTURING THE SAME

(75) Inventors: Atsuko Iida, Yokohama (JP); Yutaka Onozuka, Yokohama (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 12/350,727

(22) Filed: Jan. 8, 2009

(65) Prior Publication Data

US 2009/0179317 A1  Jul. 16, 2009

(30) Foreign Application Priority Data

Jan. 11, 2008  (JP) ............... 2008-004100

(51) Int. Cl.
H01L 21/98 (2006.01)

(52) U.S. Cl. ............... 257/685; 257/415; 257/E23.002; 257/E21.705

(58) Field of Classification Search ............ 257/685, 257/686, 777, 723, 787, 788, 789, 790, 791, 257/795, E31.117, E51.02, E23.116, E23.121, 257/E23.126, E23.02, E21.705, 415; 438/107
See application file for complete search history.

(56) References Cited

U.S. PATENT DOCUMENTS

| | | | | |
|---|---|---|---|---|
| 5,641,997 A * | 6/1997 | Ohta et al. | ................... | 257/788 |
| 6,265,768 B1 * | 7/2001 | Su et al. | ..................... | 257/684 |
| 6,376,915 B1 * | 4/2002 | Hikita et al. | ................ | 257/777 |
| 2004/0178495 A1 * | 9/2004 | Yean et al. | ................... | 257/723 |
| 2006/0244119 A1 * | 11/2006 | Ishimaru et al. | ............ | 257/686 |
| 2007/0273018 A1 * | 11/2007 | Onozuka et al. | ........... | 257/690 |
| 2008/0318356 A1 | 12/2008 | Onozuka et al. | | |

FOREIGN PATENT DOCUMENTS

JP  2004-103955  4/2004
JP  2007-260866  10/2007

OTHER PUBLICATIONS

Japanese Office Action for 2008-004100 mailed on Dec. 25, 2009.

* cited by examiner

*Primary Examiner*—A. Sefer
(74) *Attorney, Agent, or Firm*—Turocy & Watson, LLP

(57) ABSTRACT

It is made possible to restrict warpage at the time of resin cure and achieve a smaller thickness. A semiconductor device includes: a first chip including a MEMS device and a first pad formed on an upper face of the MEMS device, the first pad being electrically connected to the MEMS device; a second chip including a semiconductor device and a second pad formed on an upper face of the semiconductor device, the second pad being electrically connected to the semiconductor device; and an adhesive portion having a stacked structure, and bonding a side face of the first chip and a side face of the second chip, the stacked structure including a first adhesive film formed by adding a first material constant modifier to a first resin, and a second adhesive film formed by adding a second material constant modifier to a second resin.

6 Claims, 25 Drawing Sheets

1A

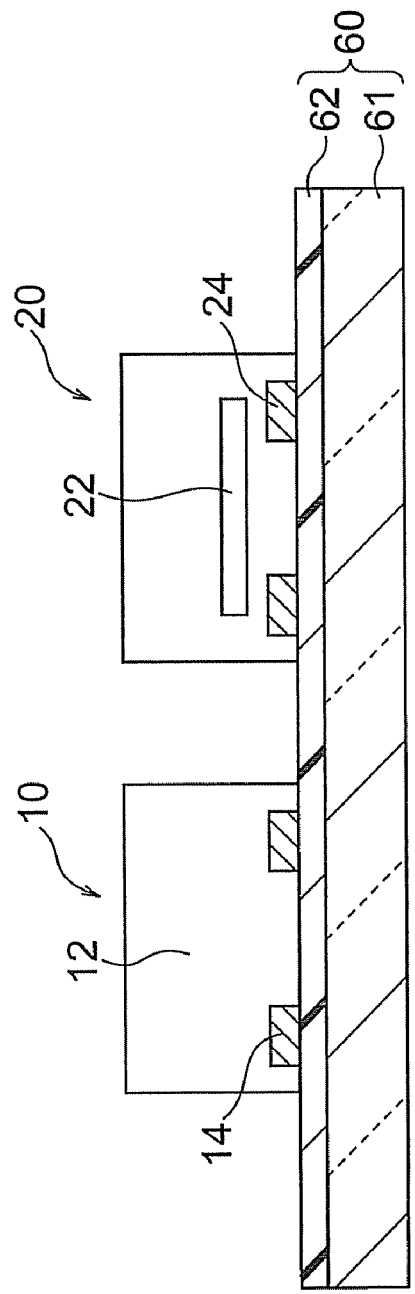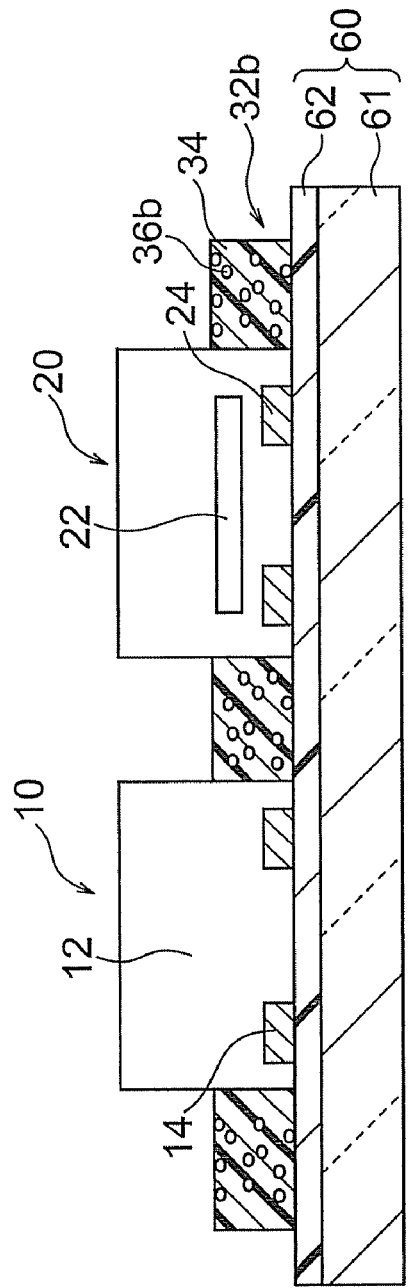

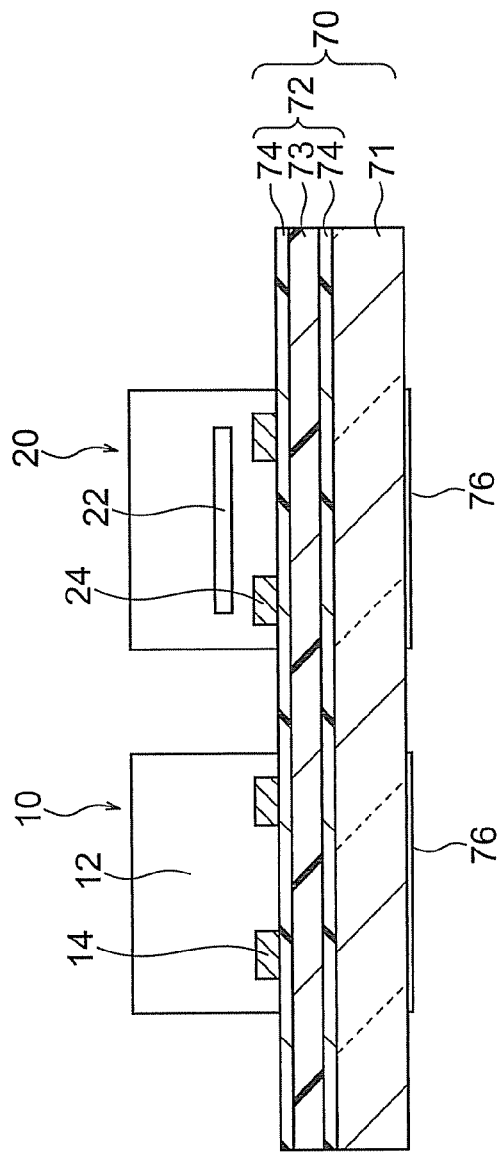
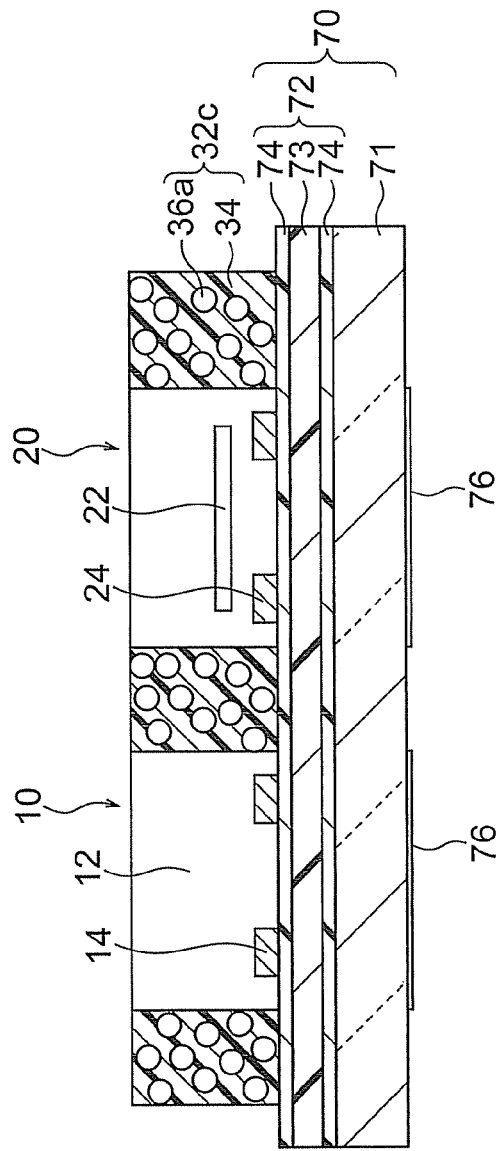
FIG. 19A
FIG. 19B

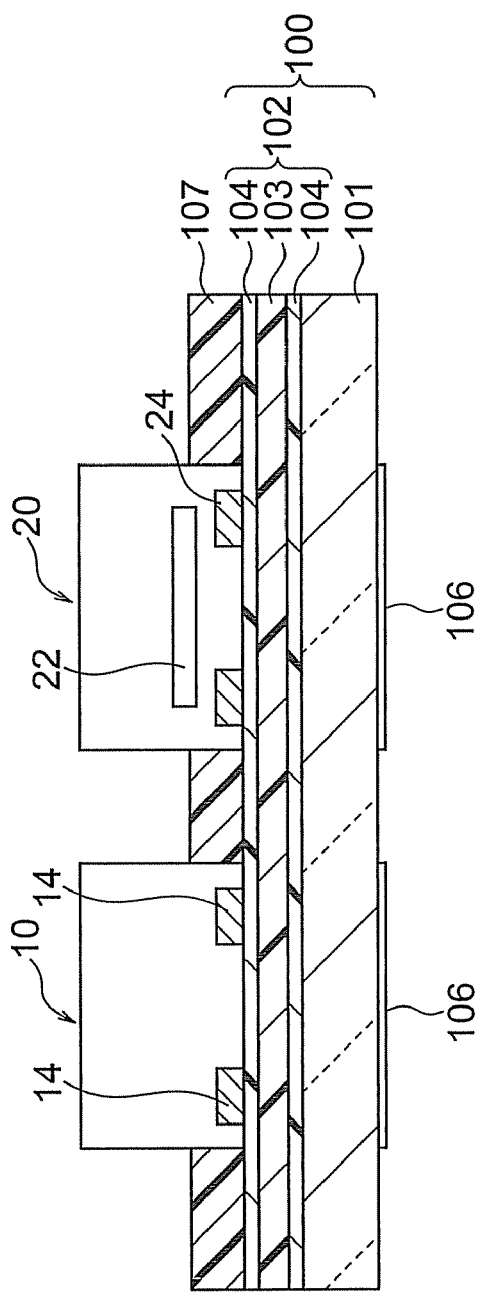
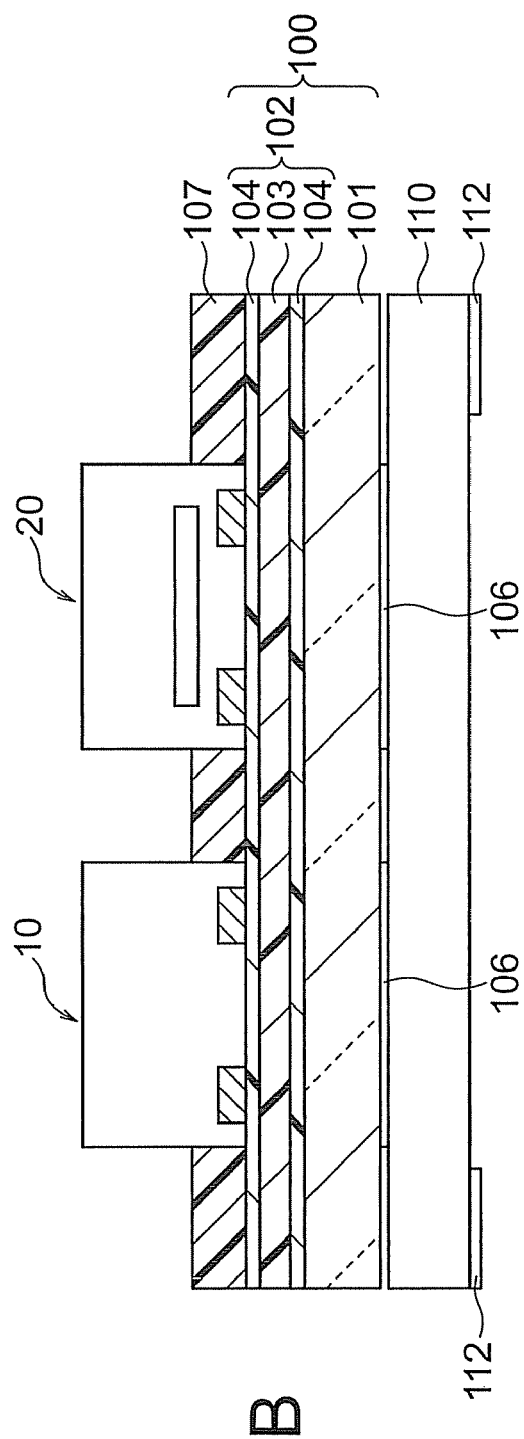
FIG. 28A
FIG. 28B

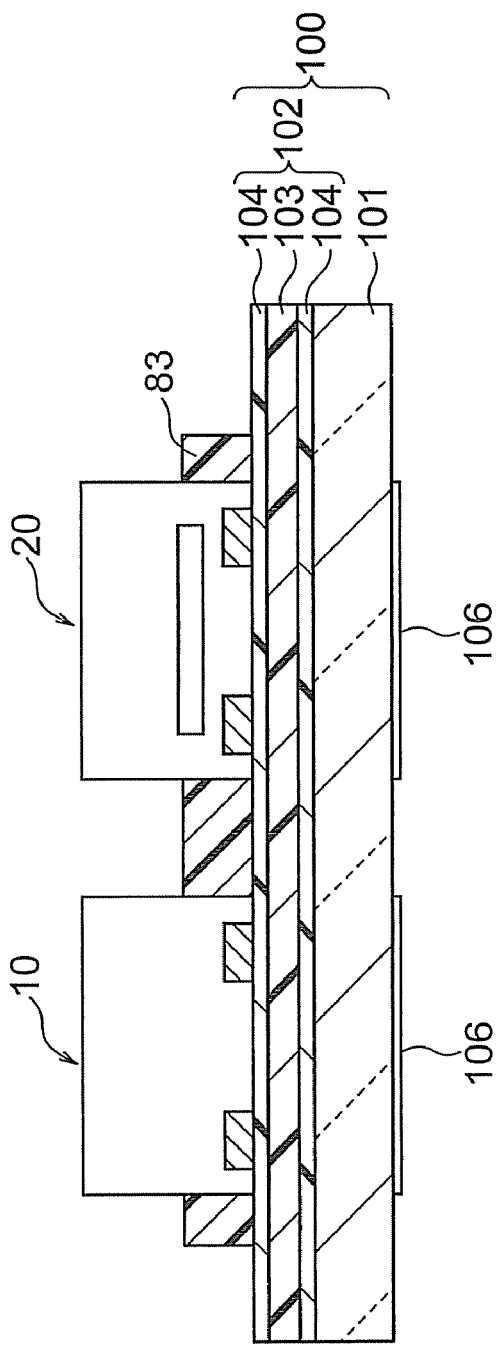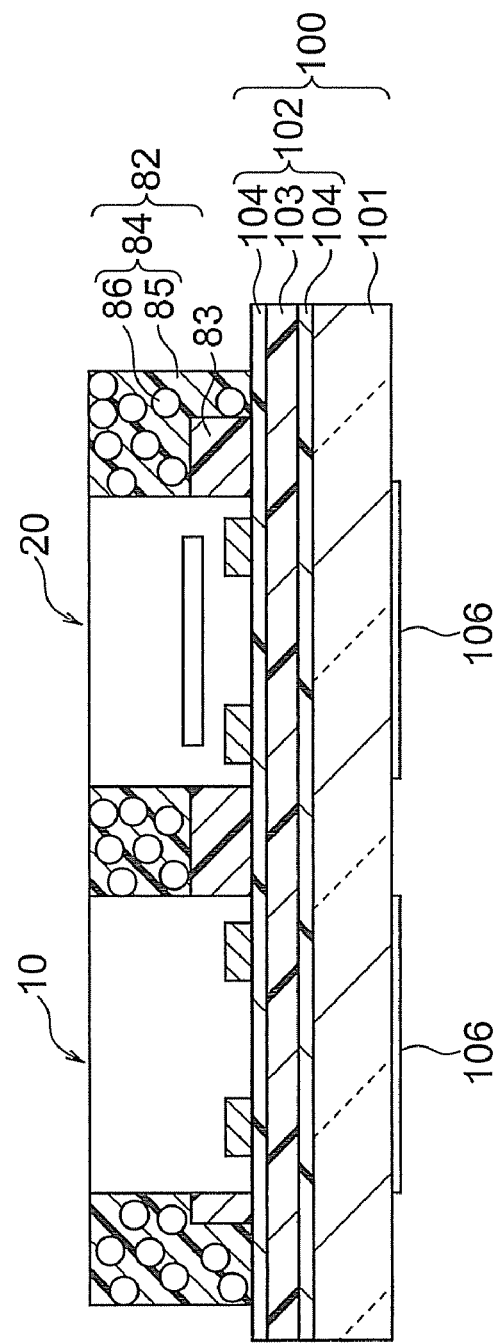

SEMICONDUCTOR DEVICE HAVING AN ADHESIVE PORTION WITH A STACKED STRUCTURE AND METHOD FOR MANUFACTURING THE SAME

CROSS-REFERENCE TO RELATED APPLICATION

This application is based upon and claims the benefit of priority from prior Japanese Patent Application No. 2008-4100 filed on Jan. 11, 2008 in Japan, the entire contents of which are incorporated herein by reference.

BACKGROUND OF THE INVENTION

1. Field of the Invention

The present invention relates to a semiconductor device and a method for manufacturing the semiconductor device.

2. Related Art

As digitalization and broadbandization have rapidly progressed in precision electronic devices such as portable telephone devices, portable information terminals, and digital appliances, there is an increasing demand for semiconductor devices with multiple functions, high-performance semiconductor devices, less expensive semiconductor devices, and high-density semiconductor devices. In this trend, there is a need for a novel mounting technique for mounting different kinds of devices such as logic devices, memories, sensors, and passive elements on a substrate at high density at low costs. Examples of those devices include Si devices such as CMOSLSI, high-speed devices containing GaAs, light emitting devices, and MEMS (Micro-Electro-Mechanical Systems).

MEMS is a generic term for minute structures manufactured by a silicon fine processing technique. The MEMS technique is expected to be applied in various fields, such as pressure sensors, acceleration sensors, ink jet printers, and filters. To construct a system with devices using the MEMS technique, it is necessary to integrate a MEMS device and a semiconductor chip (a logic, an analog amplifier, a memory, or the like) on the same substrate.

To solve the problems in the conventional mounting techniques such as SMT (Surface Mounting Technique) and MCM (Multi Chip Module) so as to meet the above need, the following two integration techniques have been developed. One of the two techniques is called System-On-Chip (SOC), by which more than one device is formed directly on one chip. By this technique, high device integration is achieved, and minute global wires can be used between the devices, since the devices are formed on one chip. Accordingly, higher integration and higher performance can be achieved with a thinner package. However, there are restrictions on the devices that can be integrated. For example, it is difficult to form a device containing a crystalline material such as GaAs on a Si substrate, because of the difference in lattice constant and the difference in linear expansion coefficient. Also, a device such as a LSI requiring high-precision design rules and a device formed by low-precision design rules cannot be efficiently produced in the same procedures. Particularly, all the processes need to be changed, when a new device is incorporated. Therefore, the costs for development of a new device are high, and the development period is long.

The other technique is called System-In-Package (SIP). By this technique, chips are formed separately from one another, and each of them is mounted on a substrate that is a so-called interposer. Since the devices can be formed independently of one another, there are few restrictions on the devices. Also, when a new system is developed, the existing chips can be used. Accordingly, the development cost is low, and the development period is short. However, the problem with this technique is that the interposer and the chips are connected with bonding wires and bumps or the likes. Therefore, it is difficult to achieve high density in chip arrangement, and to form minute wires and a thinner package.

In this trend, a pseudo SOC technique is now being developed as a new integration technique for achieving the advantages of both SOC and SIP. By the pseudo SOC technique, different kinds of devices are rearranged and recombined with an adhesive resin, and a semiconductor device formed on one substrate is virtually produced. Since the existing chips can be incorporated as in the case of SIP, a new device can be developed in a short period of time at low costs. Also, an insulating layer or a metal thin film is formed over a substrate having different kinds of chips integrated thereon, and a global multilayer wiring layer is formed between the chips. With this arrangement, the same minute wiring structure as that of SOC can be formed, and higher performance and higher integration can be achieved.

JP-A 2004-103955 (KOKAI) discloses a semiconductor device having semiconductor chips buried in a resin as described above. According to JP-A 2004-103955 (KOKAI), a corrective element is used for correcting deformation caused in resin layers at the time of cure of the resin material, and a resin layer having chips buried therein is formed on a stacked structure formed with a resin layer and the corrective element. The corrective element is made of a material such as glass, carbon, or aramid resin, which has a smaller thermal expansion coefficient and a greater Young's modulus than the burying resin. With such a corrective element, shrinkage of resin during the cure shrinkage process is restricted, and the warpage is corrected. By the technique disclosed in JP-A 2004-103955 (KOKAI), however, the semiconductor device is a stacked structure of the resin and the corrective element. Therefore, the device cannot be made thinner, and high integration cannot be achieved.

As described above, by the conventional integration technique for burying chips in resin, a corrective element needs to be added so as to reduce the warpage caused at the time of cure. Therefore, the device cannot be made thinner, and higher integration cannot be achieved.

SUMMARY OF THE INVENTION

The present invention has been made in view of these circumstances, and an object thereof is to provide a semiconductor device and a method for manufacturing the semiconductor device that can restrict warpage at the time of resin cure and can achieve a smaller thickness.

A semiconductor device according to a first aspect of the present invention includes: a first chip including a MEMS device and a first pad formed on an upper face of the MEMS device, the first pad being electrically connected to the MEMS device; a second chip including a semiconductor device and a second pad formed on an upper face of the semiconductor device, the second pad being electrically connected to the semiconductor device; and an adhesive portion having a stacked structure, and bonding a side face of the first chip and a side face of the second chip, the stacked structure including a first adhesive film formed by adding a first material constant modifier to a first resin, and a second adhesive film formed by adding a second material constant modifier to a second resin.

A method for manufacturing a semiconductor device according to a second aspect of the present invention includes: temporarily bonding a first chip and a second chip to a supporting substrate, with upper faces of the first chip and the second chip facing the supporting substrate, the first chip including a MEMS device and having a first pad formed on an upper face of the MEMS device, the first pad being electrically connected to the MEMS device, the second chip including a semiconductor device and having a second pad formed on an upper face of the semiconductor device, the second pad being electrically connected to the semiconductor device; forming an adhesive portion between the first chip and the second chip, the adhesive portion having a stacked structure and bonding a side face of the first chip and a side face of the second chip, the stacked structure including a first adhesive film formed by adding a first material constant modifier to a first resin, and a second adhesive film formed by adding a second material constant modifier to a second resin; and removing the supporting substrate from the upper face side of the first and second chips.

BRIEF DESCRIPTION OF THE DRAWINGS

FIGS. 14A and 14B are cross-sectional views illustrating a method for manufacturing a semiconductor device of Example 1 of the present invention;

FIGS. 19A and 19B are cross-sectional views illustrating a method for manufacturing a semiconductor device of the Example 3;

FIGS. 28A and 28B are cross-sectional views illustrating a method for manufacturing a semiconductor device of the Example 6; and FIGS. 29A and 29B are cross-sectional views illustrating a method for manufacturing a semiconductor device of the Example 6.

DETAILED DESCRIPTION OF THE INVENTION

The following is a description of embodiments of the present invention, with reference to the accompanying drawings.

First Embodiment

Figure 1:
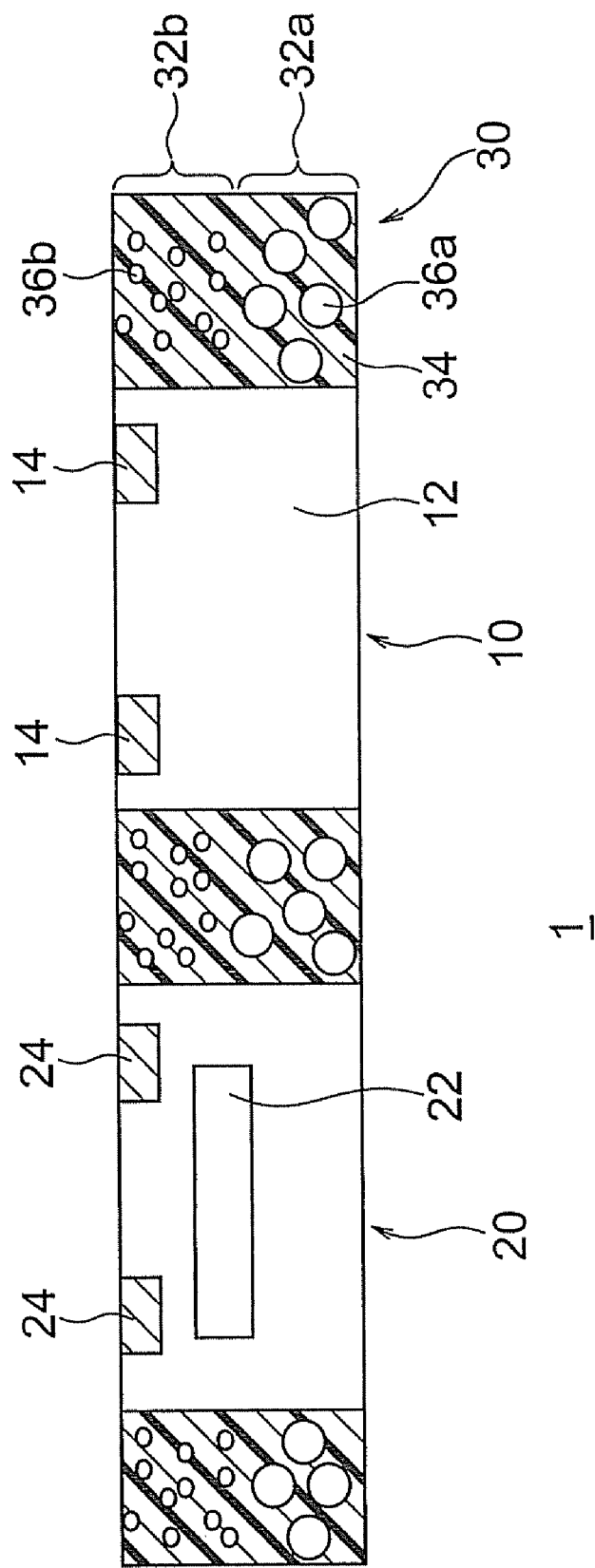
FIG. 1 is a cross-sectional view of a semiconductor device in accordance with a first embodiment of the present invention.

FIG. 1 illustrates a semiconductor device in accordance with a first embodiment of the present invention. The semiconductor device 1 of this embodiment includes a semiconductor chip 10, a MEMS chip 20, and adhesive layers 30 that are provided on the side faces of those chips and bond the semiconductor chip 10 and the MEMS chip 20. The semiconductor chip 10 contains a semiconductor device 12 (such as a CMOS device). Pads 14 that are electrically connected to the semiconductor device 12 are provided in the upper face of the semiconductor chip 10. The MEMS chip 20 contains a MEMS device 22. Pads 24 that are electrically connected to the MEMS device 22 are provided in the upper face of the MEMS chip 20. The adhesive layers 30 each have a stacked structure of adhesive films 32a and 32b that have different material constant modifiers contained in resin. The adhesive film 32a has a structure in which a filler 36a containing silica as the principal component with a relatively large mean particle size is added to the resin 34, and the adhesive film 32b has a structure in which a filler 36b containing silica as the principal component with a relatively small mean particle size is added to the resin 34. Where the sides having the pads 14 and 24 exposed through the surfaces are the principal surfaces of the chips 10 and 20, each adhesive film 32b provided on the principal surface side of the chips 10 and 20, and each corresponding adhesive film 32a provided on the opposite side from the principal surface side form a stacked structure. In this embodiment, the adhesive layers 30 are provided not only between the chips 10 and 20, but also around the chips 10 and 20.

Table 1 shows the material constants of the filler mean particle size, the linear expansion coefficient, the Young's modulus, and the Poisson's ratio of the epoxy resin including the filler containing silica as the principal component.

TABLE 1

Physical values of filler additive resins and adhesive strength comparisons

| | Particle size μm | additive amount Vol % | cure shrinkage ratio % | linear expansion coefficient ppm | Young's modulus MPa | Poisson's ratio | adhesive strength comparison |
|---|---|---|---|---|---|---|---|
| simple epoxy resin | — | — | 1.28 | 55 | 2500 | 0.45 | 1 |
| regular filler additive resin | 5-50 | 33.3 | 0.85 | 37 | 4900 | 0.34 | 0.82 |
| | | 54 | 0.59 | 23 | 7200 | 0.29 | 0.76 |
| | | 74 | 0.33 | 10 | 14000 | 0.25 | 0.52 |
| superfine particle additive resin | 0.01 | 5.3 | 1.21 | 24 | 6700 | 0.29 | 0.97 |

Figure 3:
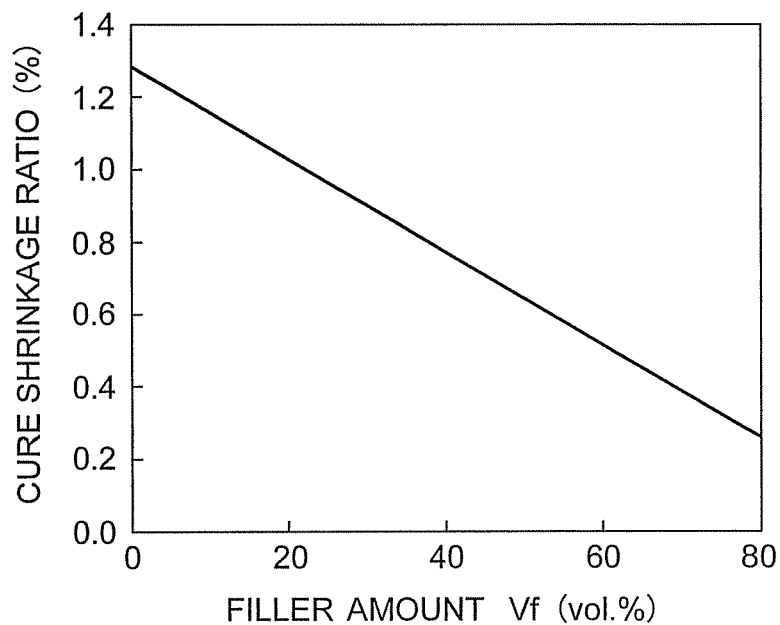
FIG. 3 shows the relationship between the filler amount of epoxy resin and the resin cure shrinkage ratio.

For example, in a case where silica having a regular mean particle size of 5 μm to 50 μm is added to an acid anhydrous epoxy resin to be the base, the cure shrinkage ratio S of the filler added resin is expressed as:

$$S=(Sr \times Vr)/(Vr+Vf) \quad (1)$$

where Vr (vol. % (volume %)) represents the volume fraction of the base resin, Vf (vol. %) represents the volume fraction of the filler having the regular particle size, and Sr represents the cure shrinkage ratio of the simple resin. FIG. 3 shows the correlation between the volume fraction of the filler Vf having the regular particle size (5 μm to 50 μm) and the resin cure shrinkage ratio S. The cure shrinkage ratio depends on the volume fraction of the resin, and becomes lower as the filler amount becomes larger.

The Young's modulus Y of the resin also depends on the volume fraction Vf of the filler having the regular particle size, and is expressed as follows:

$$Y=Yr/(1-(Vf)^{1/2}+(Vf)^{1/2}/\{1-[(Vf)^{1/2} \times (1-Yr/Yf)]\}) \quad (2)$$

(See "On Simplified Composite Micromechanics, Equation and Inverse Mixture Rule" by R. Sharma and S. Ranta, J. Reinf. Plast. Compos. Vol. 23, no. 14, pp. 1465-72 (2004), for example).

Figure 4:
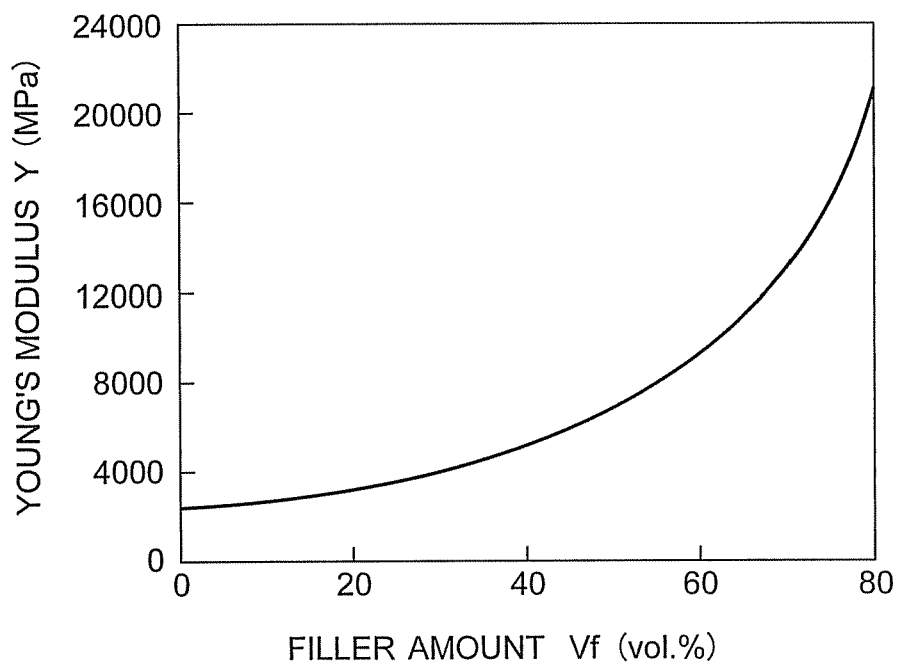
FIG. 4 shows the relationship between the filler amount of epoxy resin and the Young's modulus of the resin.

In the above equation (2), Yr represents the Young's modulus of the simple resin, and Yf represents the Young's modulus of the filler having the regular particle size. FIG. 4 shows the correlation between the volume fraction Vf of the filler having the regular particle size and the Young's modulus Y of the resin. The Young's modulus Y increases, as the filler amount Vf increases. The linear expansion coefficient and the Poisson's ratio become smaller, as the amount of the filler having the regular particle size increases.

The adhesive strength of the resin depends on the volume fraction of the simple resin that serves to develop the adhesiveness.

Figure 5:
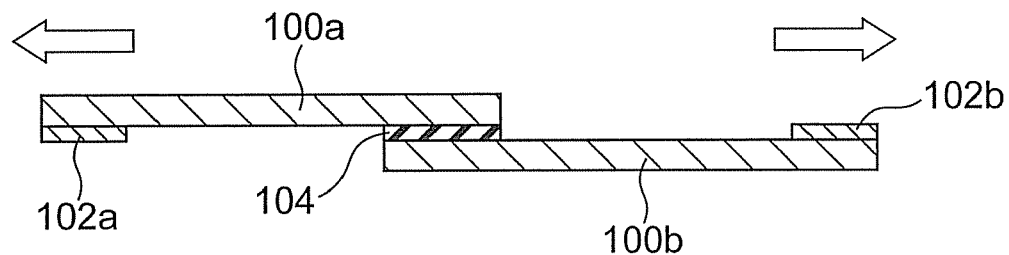
FIG. 5 is a schematic view for explaining a method for measuring the adhesive strength of a resin.

Referring now to FIG. 5, a method for measuring resin adhesive strength through tensile shear (see JIS K 6850) is described. A resin layer 104 is formed between two test pieces 100a and 100b made of the aluminum alloy JIS H-4000A-5042P. After the resin layer 104 is cured, the test pieces 100a and 100b are pulled in the opposite directions at 1 mm/minute. The adhesive strength is then calculated by dividing the breaking load (kg) of the resin layer 104 by the adhesion area (cm²). Finger portions 102a and 102b made of the same aluminum alloy are provided on the respective test pieces 100a and 100b, and the tensile load is applied from the finger portions 102a and 102b. With the adhesive strength of a simple resin obtained by this measuring method being 1, the adhesive strength of the resin layer to which 33.3 vol. % filler having the regular particle size is added is 0.82, and the adhesive strength of the resin layer to which 74 vol. % filler having the regular particle size is added is as low as 0.52 (see Table 1).

In a case where submicron particles are used as the filler, more particularly, where silica having a so-called superfine particle size of 100 nm or less is used as the filler, the Young's modulus dramatically increases only with an addition of several vol. %, unlike the Young's modulus observed in the case where the filler having the regular particle size is added (see the open briefing material of "Nanoparticles Synthesis and Functionalization Project", Post-Project Evaluation Session, Agenda Item 6.3 in the project briefing material, Evaluation on Function Development Using Single Nanoparticle, for example). This is because the addition of the small amount of superfine particles restricts the movement of the polymeric molecular chain. Like the Young's modulus, the linear expansion coefficient derived from the movement of the molecular chain and the Poisson's ratio decrease only with an addition of several vol. %, unlike the linear expansion coefficient and the Poisson's ratio observed in the case where the filler having the regular particle size is added. However, the cure shrinkage ratio of the resin depends on the volume fraction of the resin observed at the time of curing. Accordingly, the cure shrinkage ratio observed when 5.3 vol. % silica having a mean particle size of 10 nm is added is 1.21 according to the equation (1), as in the case where the filler having the regular particle size is added. Since the adhesive strength of the resin depends on the volume fraction of the resin, the adhesive strength of the resin hardly decreases.

Figure 6:
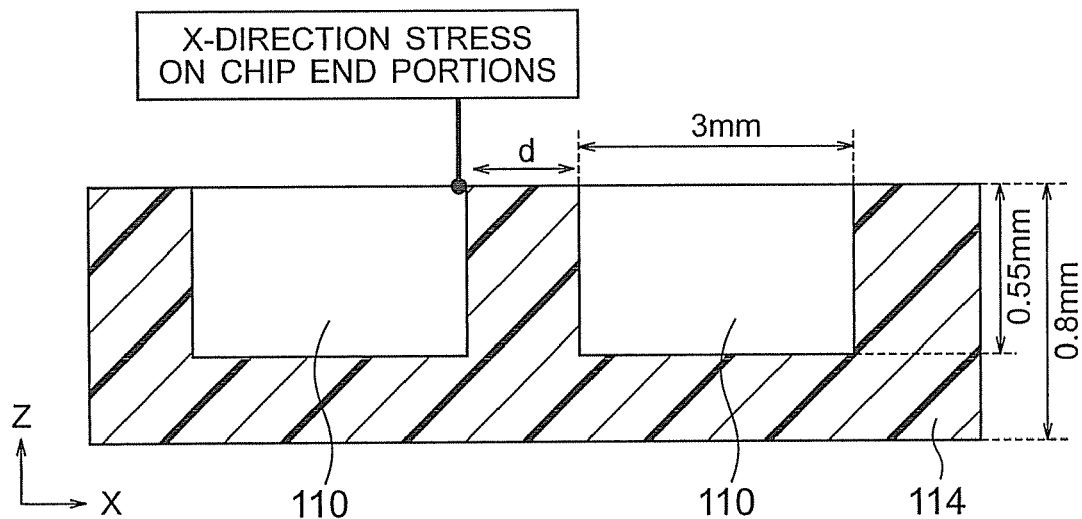
FIG. 6 is a schematic view for explaining stress analysis in the semiconductor device.
Figure 7:
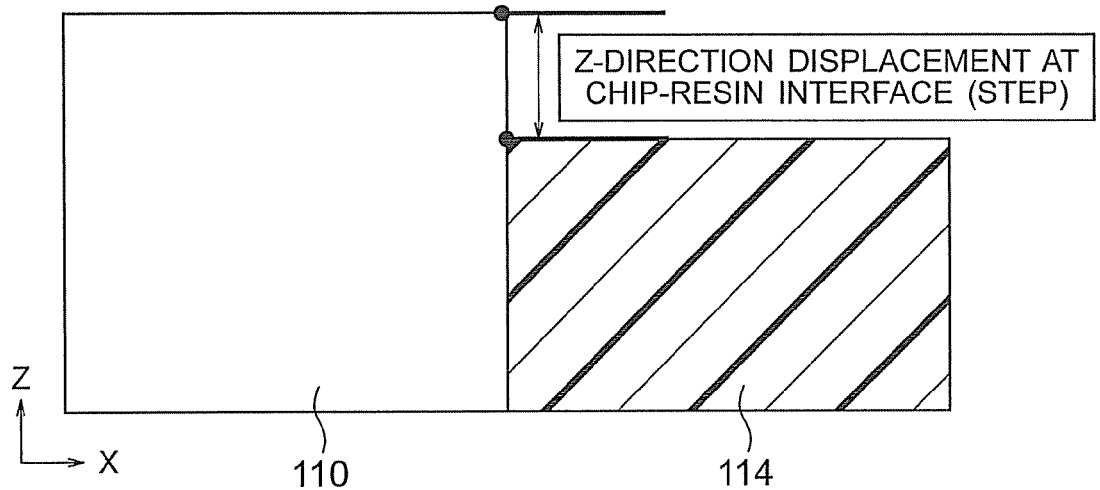
FIG. 7 is a schematic view for explaining the positional difference between a semiconductor chip and the resin caused by the curing of the resin.

Using the structural analysis software "ABAQUS" in the semiconductor device 1 of this embodiment, the stress caused at the chip end portions was estimated by the finite element approach, with the resin cure shrinkage being taken into account. As shown in FIG. 6, the analysis model has 3-mm-square, 0.55-mm thick silicon chips 110 buried in a 0.8-mm thick resin 114. Where the distance d between the chips 110 was 1 mm and 3 mm, the following values were estimated: the X-direction (the direction in which the chips 110 are arranged in parallel) stress generated at the chip end portions, and the Z-direction (the direction perpendicular to the direction in which the chips 110 are arranged in parallel) positional differences (the steps) between the chips 110 and the resin 114 in the vicinity of the module surface (see FIG. 7). The results of the simulation are shown in Table 2.

TABLE 2

Calculation results about modules with embedded chips

| | Resin conditions | | Calculation results | |
|---|---|---|---|---|
| | Particle size μm | Additive amount Vol % | Stress at chip end portion (Mpa) | Chip-resin step portion (μm) |
| Simple epoxy resin | — | — | 161 | 0.8 |
| Regular filler additive resin | 5-50 | 33.3 | 161 | 0.4 |
| | | 74 | 82 | 0.1 |
| Superfine particle additive resin | 0.01 | 5.3 | 133 | 0.2 |

The analysis was made where the resin layer 114 was a uniform layer. However, estimates of the stress to be caused in a case where the cure shrinkage ratio, Young's modulus, linear expansion coefficient, and Poisson's ratio of the burying resin are varied can be used as the yardsticks for the stress reduction effect to be achieved when resin layers with different material constants are stacked. As for the epoxy resin shown in Table 2, when a resin formed by adding 74 vol. % regular particle size filler was used as the burying resin, the stress on the end portions of the chips 110 was reduced to ½ of the stress caused in the simple resin to which fillers were not added as an adhesive layer, and the step portion at each interface between the chips 110 and the resin 114 was reduced to ⅛ of the step portion formed in the simple resin. When a resin formed by adding 5.3 vol. % silica with a mean particle size of 10 nm was used as the burying resin 114, the step portion formed at each interface between the chips 110 and the resin 114 was reduced to ¼ of the step portion formed in the simple resin, though the stress caused at the chip end portions was made only a little smaller than the stress caused in the simple resin.

In the semiconductor device 1 of this embodiment illustrated in FIG. 1, an epoxy resin to which 5.3 vol. % silica as the fine filler 36b with a mean particle size of 10 nm is added is used as the adhesive film 32b, for example. An epoxy resin to which 74 vol. % filler with a regular particle size is added is used as the adhesive film 32a. In the adhesive film 32b, the Young's modulus is 6700 MPa, the Poisson's ratio is 0.29, and the linear expansion coefficient is $24 \times 10^{-6}$. In the adhesive film 32a, the Young's modulus is 14000 MPa, the Poisson's ratio is 0.25, and the linear expansion coefficient is $10 \times 10^{-6}$. By virtue of the adhesive film 32b, the step portion between the chips 10 and 20 and the resin 30 in the vicinity of the principal surface can be made smaller. By virtue of the adhesive film 32a, the stress on the chips 10 and 20 can be reduced. Accordingly, the stress and warpage in the entire semiconductor device 1, and the step portions at the interfaces between the chips 10 and 20 and the resin 30 can be made smaller. As for the adhesive strength between the chips 10 and 20, the adhesive strength of the adhesive film 32b is 0.97, with the adhesive strength of the simple resin being 1. Compared with a case where only the first adhesive film 32a (with the adhesive strength of 0.52) is provided, a large decrease in adhesive strength can be more effectively prevented with the adhesive film 32b, and the mechanical strength of the entire semiconductor device 1 can be secured. The semiconductor device 1 of this embodiment can be made thinner than the conventional semiconductor device disclosed in JP-A 2004-103955 (KOKAI), by the thickness of the corrective element.

Figure 2:
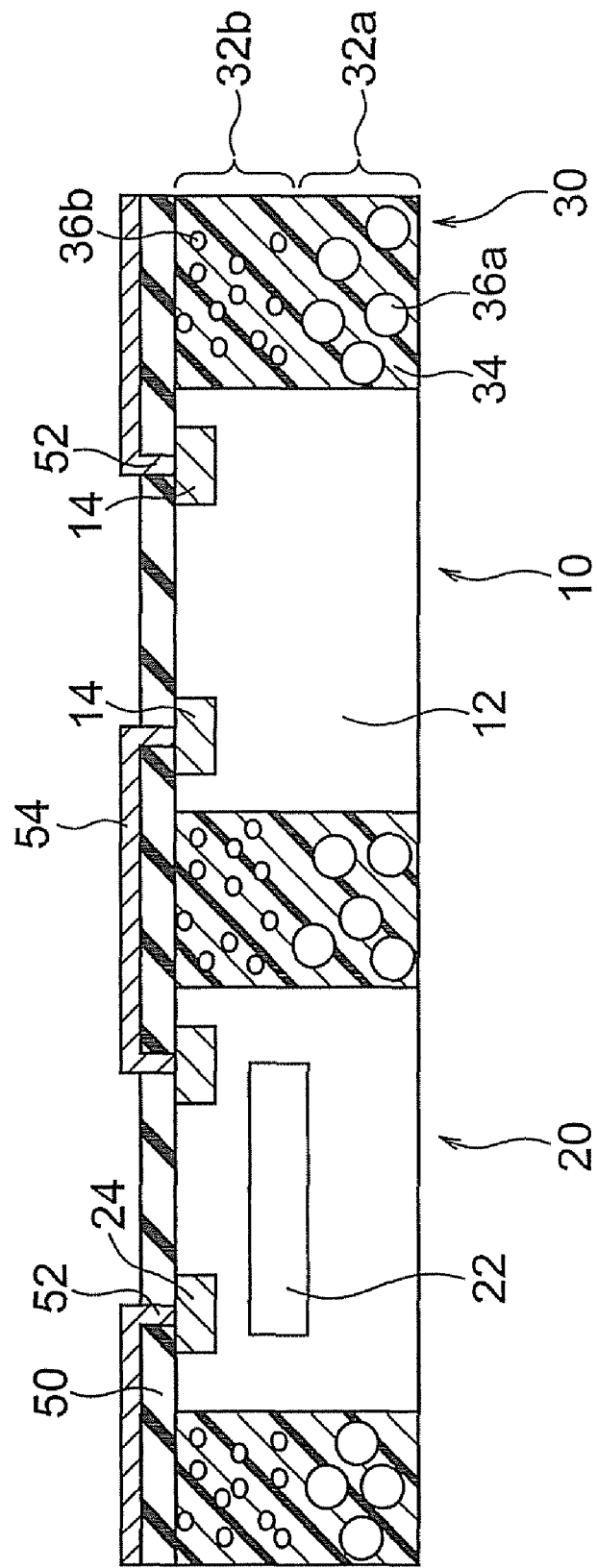
FIG. 2 is a cross-sectional view of a pseudo SOC including the semiconductor device of the first embodiment.

In the semiconductor device 1 of this embodiment, a flattening film 50 is formed on the principal surface side, and via holes 52 continuing to the pads 14 and 24 are formed in the flattening film 50, as shown in FIG. 2. After wires 54 are formed to fill the via holes 52, a pseudo SOC is completed. The wires 54 include a wire that electrically connects a pad 14 of the semiconductor chip 10 to a pad 24 of the MEMS chip 20 so as to electrically connect the semiconductor chip 10 to the MEMS chip 20, and a wire that connects the semiconductor chip 10 or the MEMS chip 20 to the outside.

In a conventional semiconductor device, detachment is caused between the chips and the adhesive layer due to the stress caused by the difference in thermal expansion between the adhesive layer and the chips during the wire forming process, as well as the residual stress caused at the time of cure of the adhesive layer. As a result, the wires are cut off at the step portions on the principal surface side, and a connection error is caused in a defective mode. In this embodiment, on the other hand, the adhesive layer 30 has a multilayer structure formed with resins containing different material constant modifiers. Accordingly, the Young's modulus can be increased, and the linear expansion coefficient and the Poisson's ratio can be lowered, while the adhesive strength of the adhesive layer 30 in the vicinity of the principal surface side is maintained. Accordingly, detachment between the chips 10 and 20 and the adhesive layer 30 can be prevented, and cutoffs of the wires can also be prevented.

Figure 8:
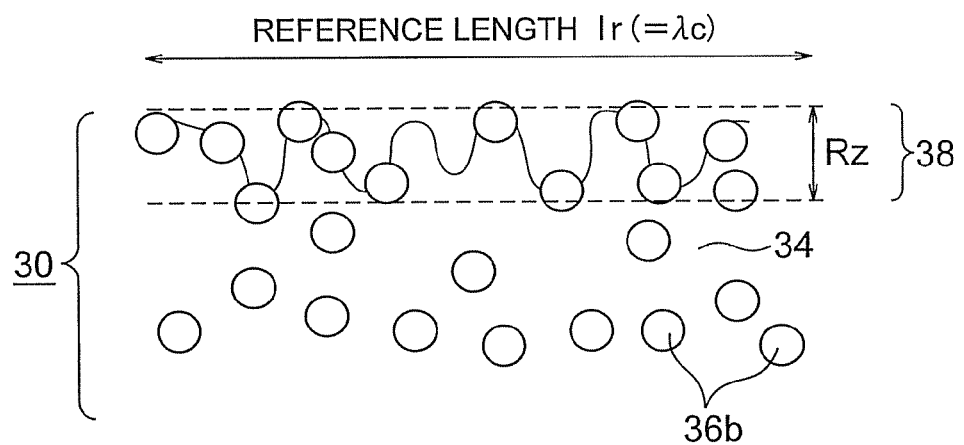
FIG. 8 is a schematic view for explaining the concavities and convexities in the outermost surface of each adhesive layer of the semiconductor device according to the first embodiment.

In the wire forming process, to increase the adhesive strength between the adhesive layer and the flattening film, selective etching is performed on the adhesive layer by performing plasma processing with the use of an oxygen gas containing a very small amount of fluorocarbon gas, for example. By doing so, the surface roughness of the adhesive layer is increased. In this surface roughness increasing procedure, the shapes of concavities and convexities to be formed are determined by the sizes of the fillers contained in the adhesive layer. Therefore, if the size of the filler contained in the adhesive film on the principal surface side is large, the surface is a rough surface with large concavities and convexities formed thereon, and the steps at the chip end portions become large. The large steps might cause breaking of wires. In this embodiment, however, the adhesive film 32b having a small filler size is provided on the principal surface side. Accordingly, minute concavities and convexities are formed on the surface of the adhesive film 32b, and the adhesive strength is increased. As shown in FIG. 8, the largest height (Rz) of the minute concavities and convexities 38 formed in the outermost surface of the adhesive layer 30 depends on the particle sizes of the fillers contained in the adhesive layer 30. Where fillers having small particle sizes are dispersed, minute concavities and convexities can be formed. Accordingly, in the procedure for forming the flattening film 50, minute wires can be formed if the adhesive film 32b on the principal surface side contains fine particles with a small filler size.

Figure 9:
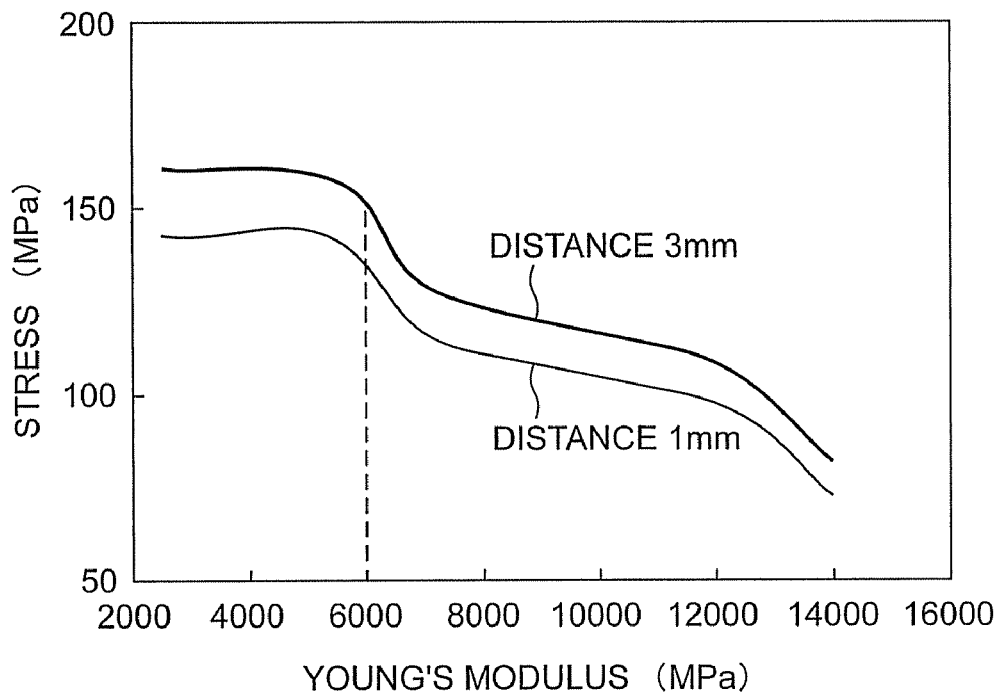
FIG. 9 shows the simulation results indicating the relationship between the Young's modulus of the resin and the stress on the semiconductor chip.

FIG. 9 shows the results of simulations performed to measure the stress on the end portions of the silicon chips 110 in a case where the Young's modulus of the resin 114 is varied in a semiconductor device having the chips 110 buried in the resin 114 as shown in FIG. 6. The stress caused in the case where the distance d between the chips 110 shown in FIG. 6 is 1 mm is smaller than the stress caused in a case where the distance d between the chips 110 is 3 mm. Also, as can be seen from FIG. 9, when the Young's modulus of the resin 114 reaches the neighborhood of 6000 MPa, the stress starts becoming smaller as the Young's modulus becomes greater in either case. According to the results of the simulations, it is preferable that the Young's modulus of the resin used in the adhesive layer 30 is 6000 MPa or more.

Figure 10:
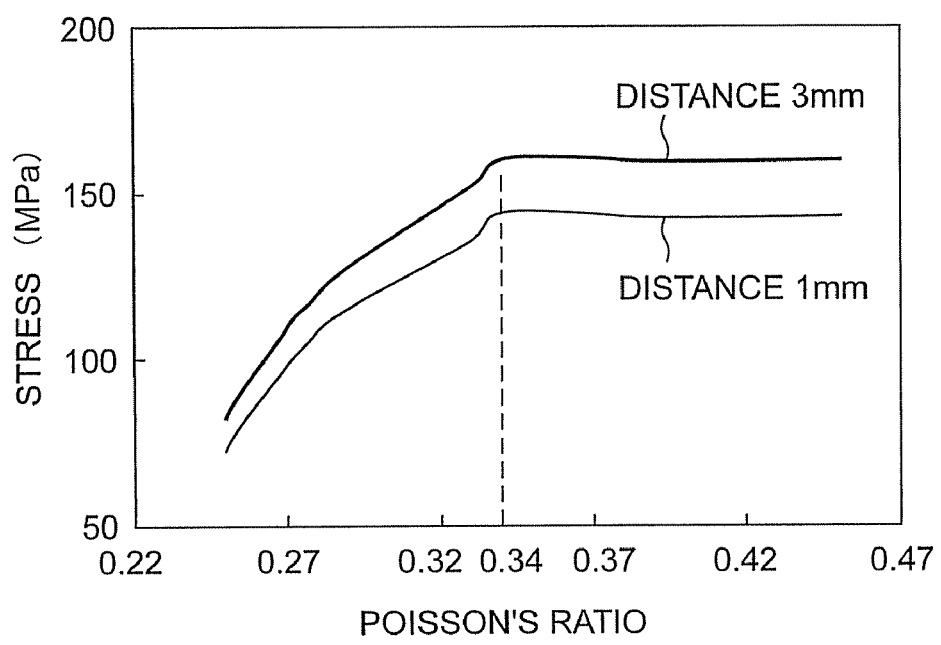
FIG. 10 shows the simulation results indicating the relationship between the Poisson's ratio of the resin and the stress on the semiconductor chip.

FIG. 10 shows the results of simulations performed to measure the stress on the end portions of the silicon chips 110 in a case where the Poisson's ratio of the resin 114 is varied in the semiconductor device having the chips 110 buried in the resin 114 as shown in FIG. 6. The stress caused in the case where the distance between the chips 110 shown in FIG. 6 is 1 mm is smaller than the stress caused in a case where the distance between the chips 110 is 3 mm. Also, as can be seen from FIG. 10, when the Poisson's ratio of the resin 114 reaches the neighborhood of 0.34, the stress starts becoming smaller as the Poisson's ratio becomes even smaller in either case. According to the results of the simulations, it is preferable that the Poisson's ratio of the resin used in the adhesive layer 30 is 0.34 or less.

Figure 11:
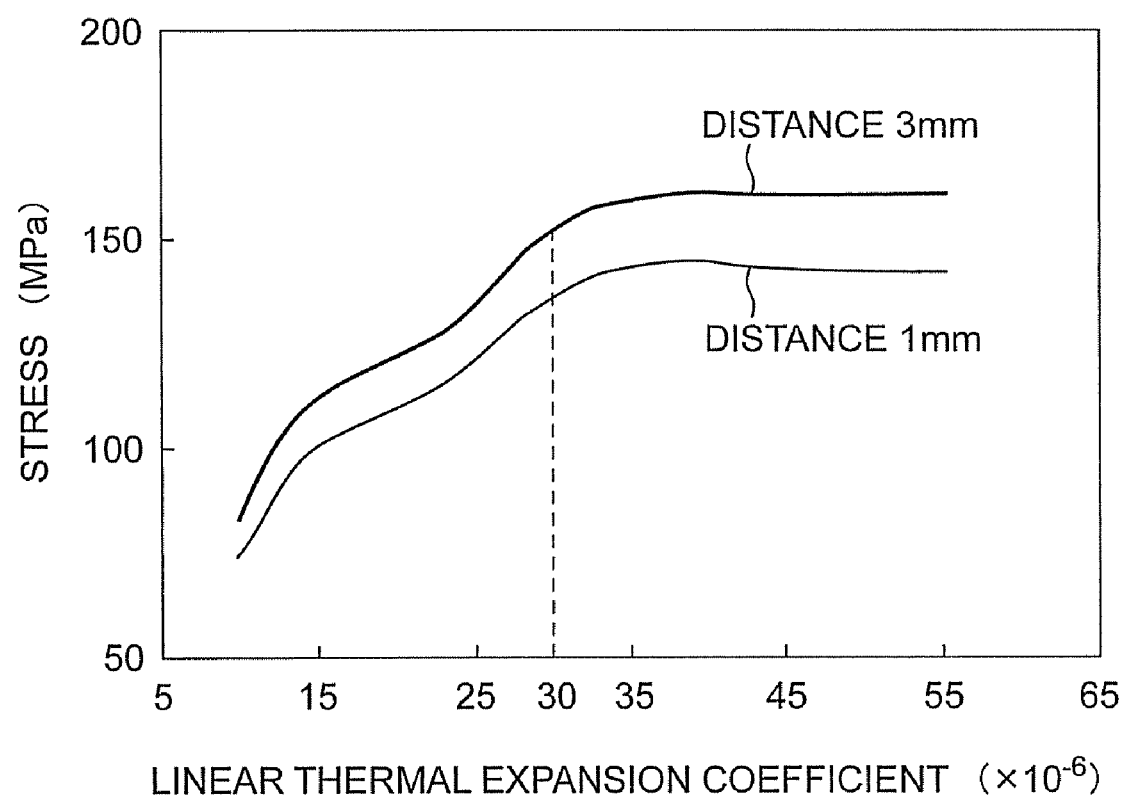
FIG. 11 shows the simulation results indicating the relationship between the linear expansion coefficient of the resin and the stress on the semiconductor chip.

FIG. 11 shows the results of simulations performed to measure the stress on the end portions of the silicon chips 110 in a case where the linear expansion coefficient CTE of the resin 114 is varied in the semiconductor device having the chips 110 buried in the resin 114 as shown in FIG. 6. The stress caused in the case where the distance between the chips 110 shown in FIG. 6 is 1 mm is smaller than the stress caused in a case where the distance between the chips 110 is 3 mm. Also, when the linear expansion coefficient of the resin 114 reaches the neighborhood of $30 \times 10^{-6}$, the stress starts becoming smaller as the linear expansion coefficient becomes even smaller in either case. According to the results of the simulations, it is preferable that the linear expansion coefficient of the resin used in the adhesive layer 30 is $30 \times 10^{-6}$ or less.

As can be seen from the above results of the stress simulations, to reduce the stress applied onto the chips, the ranges of the preferred material constants for the adhesive layers 30 are as follows: 6000 MPa or more for the Young's modulus, 0.34 or less for the Poisson's ratio, and $30 \times 10^{-6}$ or less for the linear expansion coefficient.

As described above, in accordance with this embodiment, warpage caused at the time of the resin curing can be prevented, and the device thickness can be reduced.

Second Embodiment

Figure 12:
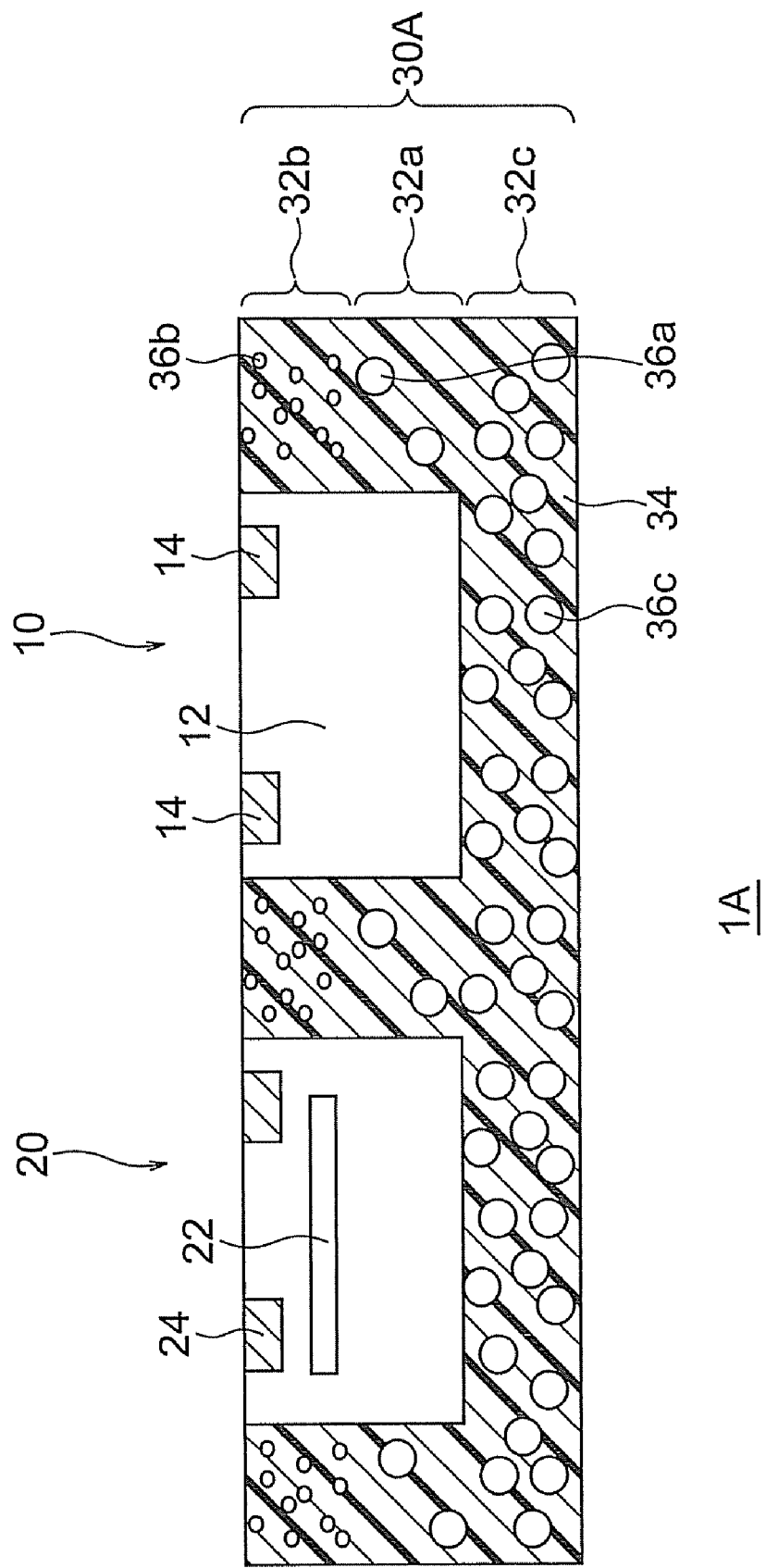
FIG. 12 is a cross-sectional view of a semiconductor device in accordance with a second embodiment of the present invention.
Figure 13:
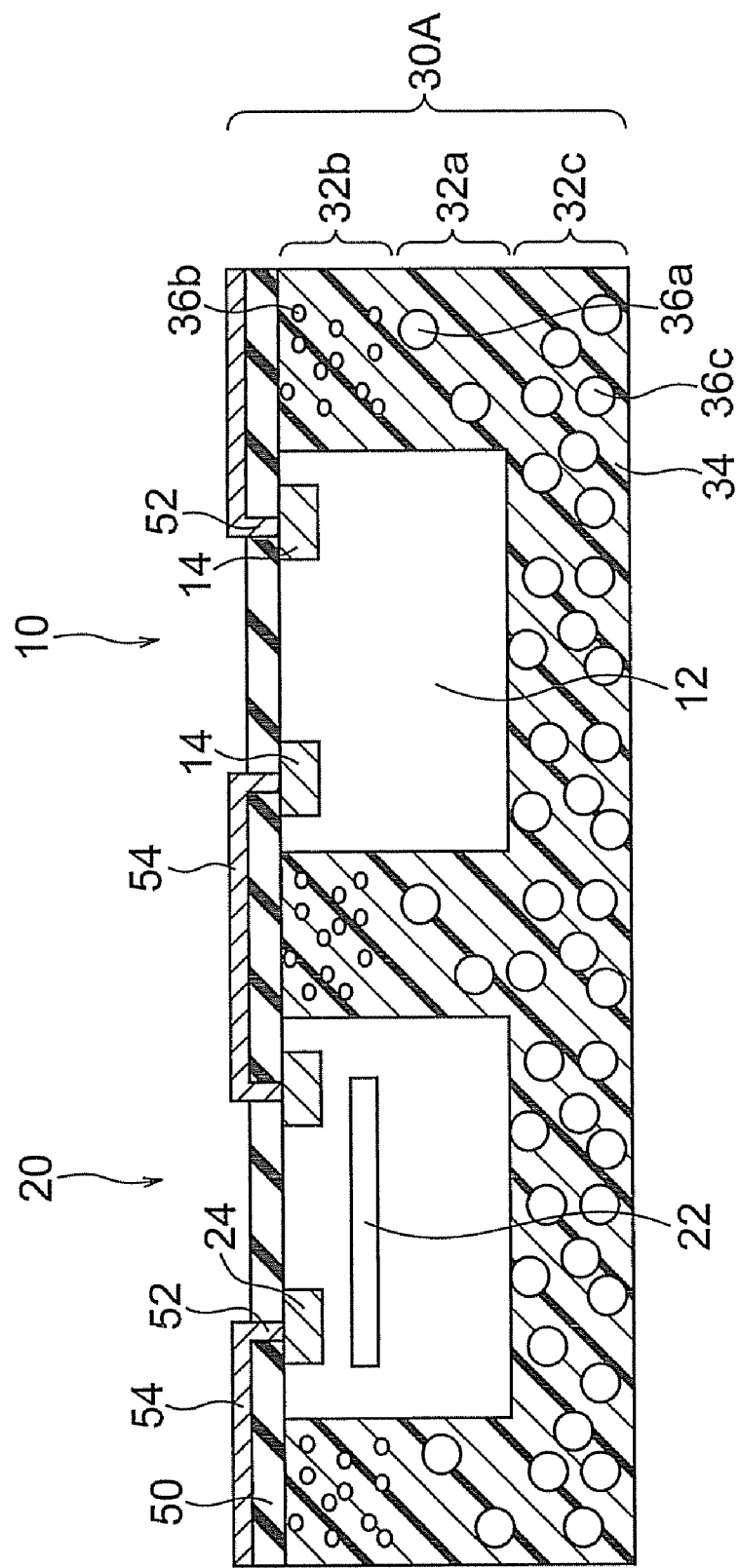
FIG. 13 is a cross-sectional view of a pseudo SOC including the semiconductor device of the second embodiment.

FIG. 12 illustrates a semiconductor device in accordance with a second embodiment of the present invention. The semiconductor device 1A of this embodiment is the same as the semiconductor device 1 of the first embodiment illustrated in FIG. 1, except that an adhesive film 32c is provided on the surfaces on the opposite side from the principal surfaces of the chips 10 and 20. The adhesive film 32c serves as a backing layer. The adhesive layer 30A that is provided between the semiconductor chip 10 and the MEMS chip 20, and bonds the semiconductor chip 10 and the MEMS chip 20 has a stacked structure formed with the adhesive film 32c, the adhesive film 32a, and the adhesive film 32b stacked in this order. The adhesive films 32a, 32b, and 32c contain at least two different material constant modifiers. The adhesive film 32b is a resin having a filler 36b added thereto. The filler 36b contains silica with a small mean particle size as the principal component. The adhesive film 32a is a resin having a filler 36a added thereto. The filler 36a has a larger mean particle size than the filler particles contained in the adhesive film 32b. The adhesive film 32c is a resin having a material constant modifier 36c added thereto. The material constant modifier 36c is different from the material constant modifiers 36a and 36b of the adhesive films 32a and 32b. Like the semiconductor device of the first embodiment shown in FIG. 2, the semiconductor device 1A of this embodiment is used as a pseudo SOC, after a flattening film 50 is formed on the principal surface side, via holes 52 continuing to the pads 14 and 24 are formed in the flattening film 50, and wires 54 are formed to fill the via holes 52 (FIG. 13). The wires 54 include a wire that electrically connects a pad 14 of the semiconductor chip 10 to a pad 24 of the MEMS chip 20 so as to electrically connect the semiconductor chip 10 to the MEMS chip 20, and a wire that connects the semiconductor chip 10 or the MEMS chip 20 to the outside.

In this embodiment, the adhesive film 32b is formed by adding 5.3 vol. % silica as the fine filler 36b with a mean particle size of 10 nm to the resin 34, for example. The adhesive film 32a is formed by adding 54 vol. % filler 36a with a regular particle size to the resin 34. The adhesive film 32c is formed by adding 74 vol. % filler 36c with the same regular particle size as the adhesive film 32a to the resin 34. In the adhesive film 32b, the Young's modulus is 6700 MPa, the Poisson's ratio is 0.29, and the linear expansion coefficient is $24 \times 10^{-6}$. In the adhesive film 32a, the Young's modulus is 7200 MPa, the Poisson's ratio is 0.29, and the linear expansion coefficient is $23 \times 10^{-6}$. In the adhesive film 32c, the Young's modulus is 14000 MPa, the Poisson's ratio is 0.25, and the linear expansion coefficient is $10 \times 10^{-6}$. As for the adhesive strength, the adhesive strength of the adhesive film 32b is 0.97, and the strength of the adhesive film 32a is 0.76.

The step portions between the chips 10 and 20 and the adhesive layers 30A on the principal surface side of the semiconductor device PA are made smaller by virtue of the addition of the superfine filler to the adhesive film 32b, and the stress on the chips 10 and 20 and the adhesive layers 30A is reduced by virtue of the addition of the filler with a regular particle size to the adhesive film 32a. In this manner, warpage and stress in the region where the chips 10 and 20 are buried are reduced, and, at the same time, the adhesive strength between the chips 10 and 20 is secured. Furthermore, as a backing layer made of a highly rigid resin material having a large Young's modulus, a low Poisson's ratio, and a low linear expansion coefficient is formed as the adhesive film 32c, the mechanical strength of the entire semiconductor device PA can be secured. Accordingly, the semiconductor device PA of this embodiment can be made thinner than the conventional semiconductor device disclosed in JP-A 2004-103955 (KOKAI), by the thickness of the corrective element.

To achieve higher integration, the distance between the chips 10 and 20 should be shortened. However, with a shorter distance between the chips 10 and 20, the amount of resin in the adhesive layer 30A existing between the chips 10 and 20 decreases, and the adhesive strength becomes lower accordingly. Therefore, it is necessary to restrict the filler additive amount in the adhesive layer 30A on the principal surface side and to secure the adhesive strength. In this embodiment, the filler having a small mean particle size is added at least to the resin in the adhesive film 32b on the principal surface side of the adhesive layer 30A between the chips 10 and 20. By doing so, the adhesive strength is maintained with the small additive amount. At the same time, the adhesive strength between the chips is secured, and the mechanical strength of the entire semiconductor device is secured.

As described above, in accordance with this embodiment, sufficient adhesive strength between the chips is secured in a semiconductor device having the chips integrated, and the mechanical strength of the entire device is secured. At the same time, warpage can be reduced, and a thinner device with higher integration can be achieved.

Next, the embodiments of the present invention are described in greater detail, with reference to the following examples.

Example 1

FIG. 1 shows a semiconductor device of Example 1 of the present invention. The semiconductor device 1 of this example includes a semiconductor chip 10, a MEMS chip 20, and an adhesive layer 30 that bonds the semiconductor chip 10 and the MEMS chip 20. The semiconductor chip 10 contains a semiconductor device 12 (such as a CMOS device). Pads 14 that are electrically connected to the semiconductor device 12 are provided in the upper face of the semiconductor chip 10. The MEMS chip 20 contains a MEMS device 22. Pads 24 that are electrically connected to the MEMS device 22 are provided in the upper face of the MEMS chip 20. The adhesive layer 30 has a stacked structure of adhesive films 32a and 32b that have different material constant modifiers contained in resin. The adhesive film 32a has a structure in which a filler 36a containing silica as the principal component with a relatively large mean particle size is added to the resin 34, and the adhesive film 32b has a structure in which a filler 36b containing silica as the principal component with a relatively small mean particle size is added to the resin 34. FIG. 2 shows a pseudo SOC having a wiring layer formed on the semiconductor device 1 of this example.

In the semiconductor device 1 of this example, the adhesive film 32b is formed by adding 5.3 vol. % silica as the fine filler 36b with a mean particle size of 10 nm to the acid anhydrous epoxy resin 34, for example. The adhesive film 32a is formed by adding 74 vol. % filler 36a with a regular particle size to the acid anhydrous epoxy resin 34. In the adhesive film 32b, the Young's modulus is 6700 MPa, the Poisson's ratio is 0.29, and the linear expansion coefficient is $24 \times 10^{-6}$. In the adhesive film 32a, the Young's modulus is 14000 MPa, the Poisson's ratio is 0.25, and the linear expansion coefficient is $10 \times 10^{-6}$.

In the semiconductor device 1 of this example having the above structure, a flattening film 50 is further formed on the principal surface of the chips 10 and 20, as shown in FIG. 2. Via holes 52 continuing to the pads 14 and 24 are formed in the flattening film 50, and wires 54 are formed to fill the via holes 52. In this manner, the pseudo SOC is completed.

Referring now to FIGS. 14A through 16C, a method for manufacturing the semiconductor device of this example is described. First, a supporting substrate 60 having a 10-μm thick acrylic adhesive layer 62 formed on a 0.8-mm thick glass substrate 61 is prepared, as shown in FIG. 14A. The CMOS chip 10 and the MEMS chip 20 are mounted on the supporting substrate 60 at desired positions, and are temporarily bonded to the supporting substrate 60 with the adhesive layer 62. The CMOS chip 10 contains the CMOS device 12 inside, and the pads 14 that are electrically connected to the CMOS device 12 are provided in the surface of the CMOS chip 10 temporarily bonded to the adhesive layer 62. The MEMS chip 20 contains the MEMS device 22 inside, and the pads 24 that are electrically connected to the MEMS device 22 are provided in the surface of the MEMS chip 20 temporarily bonded to the adhesive layer 62. The space (the distance) between the MEMS chip 20 and the CMOS chip 10 is 1 mm.

As shown in FIG. 14B, the adhesive film 32b is prepared by adding 5.3 vol. % fine filler 36b containing the silica with a mean particle size of 10 nm as the principal component to the acid anhydrous epoxy resin 34. The resin prepared as the adhesive film 32b is injected into the distance between the chips 10 and 20 by a dispenser. At this point, the injection rate of the resin is adjusted so that the resin thickness after preliminary drying is 0.2 mm, and the preliminary drying is performed at 65° C. for 30 minutes.

Figure 15A:
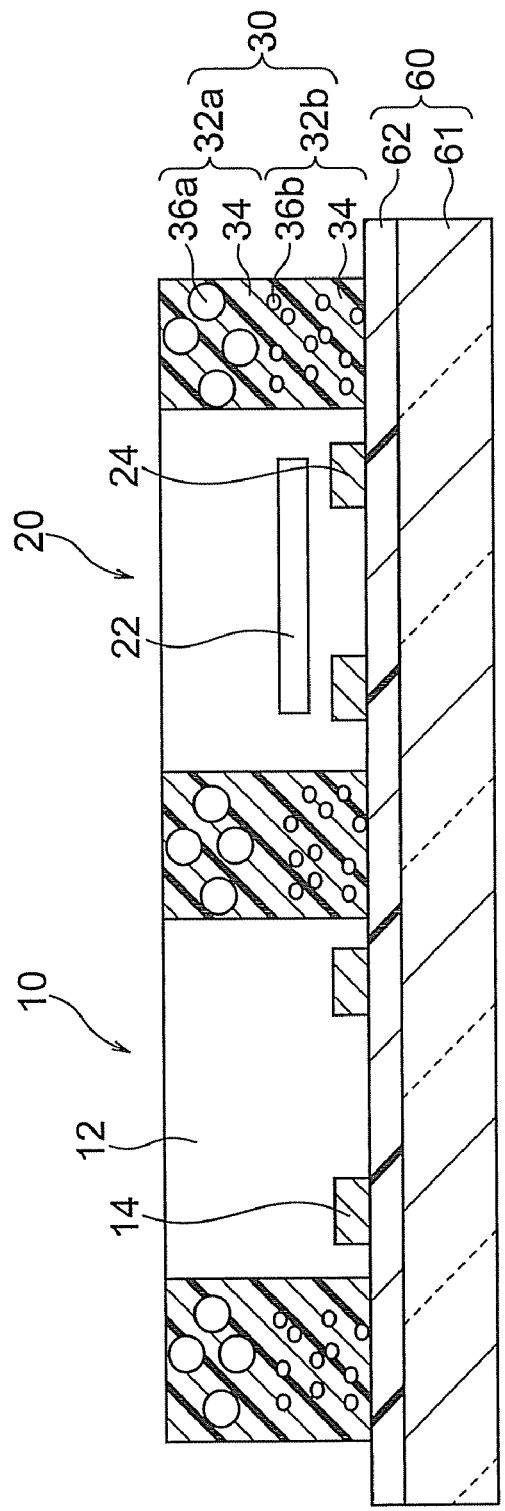
FIGS. 15A and 15B are cross-sectional views illustrating a method for manufacturing a semiconductor device of Example 1.
Figure 15B:
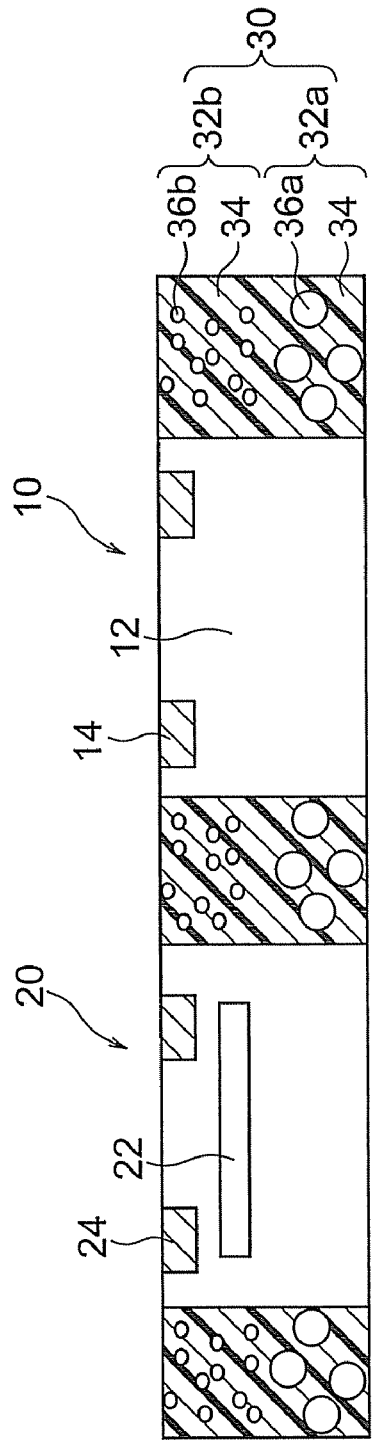

As shown in FIG. 15A, the adhesive film 32a is prepared by adding 74 vol. % filler 36a containing silica with a mean particle size of 20 μm as the principal component to the acid anhydrous epoxy resin 34. The resin prepared as the adhesive film 32a is formed on the adhesive film 32b by a printing technique using a screen plate. After that, preliminary calcination is performed at 100° C. for 30 minutes, to complete the adhesive film 32a. As shown in FIG. 15B, the supporting substrate 60 is removed, and calcination is performed at 180° C. for one hour. Thus, the semiconductor device 1 is produced.

Figures 16A, 16B, 16C:
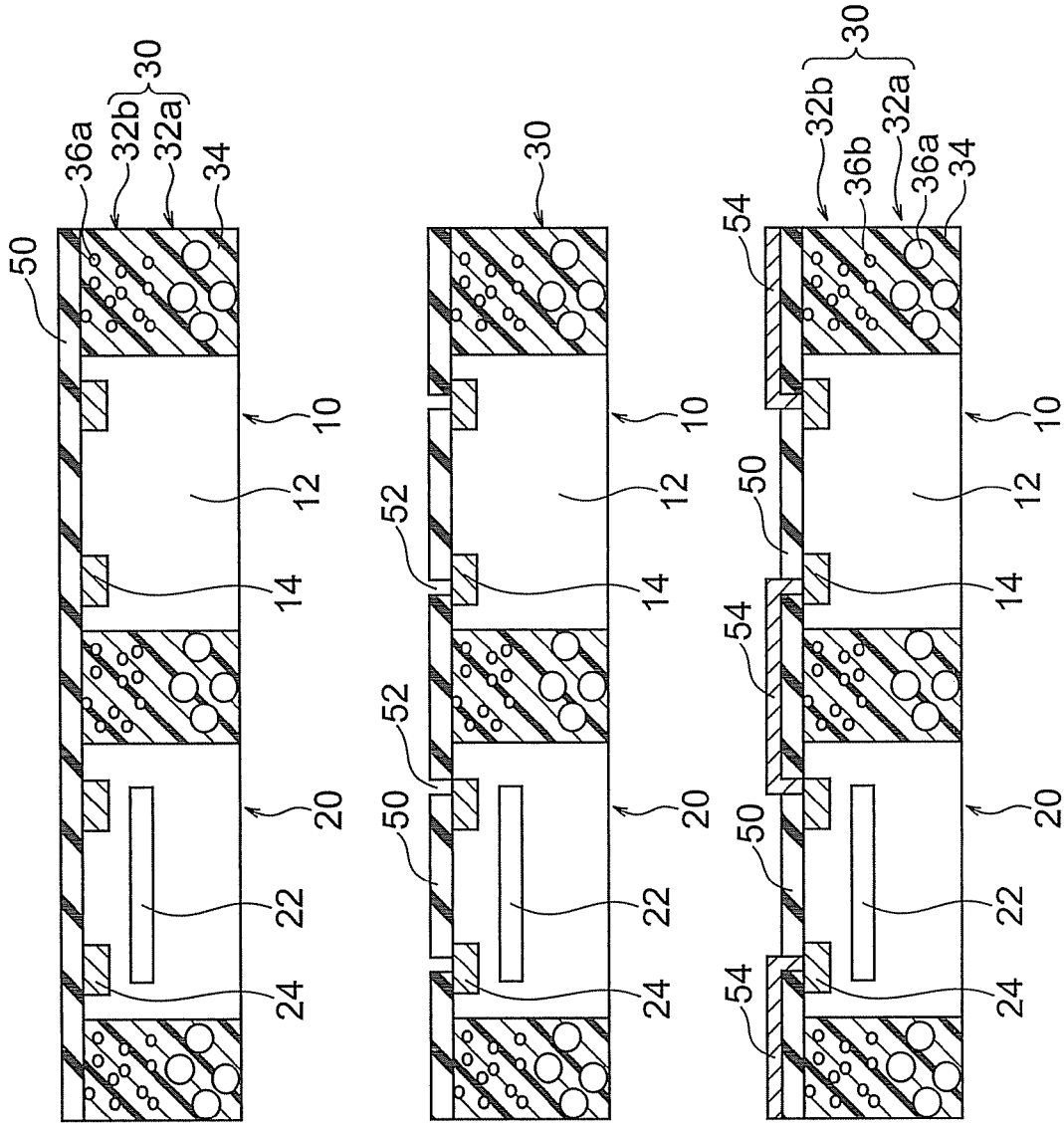
FIGS. 16A to 16C are cross-sectional views of a pseudo SOC including the semiconductor device of the Example 1.

As shown in FIG. 16A, the flattening film 50 is then formed with a photosensitive epoxy resin sheet on the principal surface side of the semiconductor device 1. After that, openings continuing to the pads 14 and 24 of the chips 10 and 20 are formed in the flattening film 50 by a photolithography technique, as shown in FIG. 16B. After vias 52 are formed by filling the openings by a plating technique, a wiring material film is deposited, and patterning is performed on the wiring material film, to form the wiring pattern 54 (FIG. 16C).

In the manufacturing method in this example, a surface processing procedure (not shown) for selectively removing the adhesive layer 30 by performing plasma processing for 10 seconds with the use of oxygen gas plasma formed by adding 5% $CF_4$ gas is carried out prior to the procedure for forming the flattening film 50, so as to increase the adhesive strength at the interface between the adhesive film 32b and the flattening film 50. As shown in FIG. 8, the numeric value that is the index of minute concavities and convexities in the outermost surface obtained through this procedure is 50 nm in the largest height (Rz) in accordance with the roughness curve of a cross section of the adhesive layer 30. The minute concavities and convexities described here are defined by JIS B 0601 (2001), and the largest height (Rz) is the sum of the maximum value of the height and the maximum value of the depth with respect to the reference length (Ir). The roughness component measured here is the component obtained by removing the components of longer wavelengths than the swell component, or the so-called cutoff frequency (λc), from the components of the roughness curve of the cross section, with Ir being normally equal to λc. The largest height Rz in the roughness curve of the cross section can be determined by the roughness component minus the swell component. However, there are cases where it is more preferable to determine the largest height Rz based on the component obtained by removing the wavelength at the boundary (λs) between the roughness component and the components of wavelengths shorter than the roughness component. In this example, λs is a value related to the filler particle size. Here, Ir=λc=1 μm, and λs=10 nm. In this example, the largest height Rz is measured in the roughness curve obtained by removing λc and λs from the roughness curve of the cross section (as defined in Section 3.1.1.1 of JIS B 0601 (2001)). The concavities and convexities in the cross section are measured with the use of a scanning electron microscope (SEM), an atomic force microscope (AFM) that detects the information about surface roughness with a minute needle, or an optical microscope that measures surface roughness by emitting laser light and detecting an optical phase difference, for example. The largest height Rz in the roughness curve obtained through the measurement can be analytically determined through image processing.

In the pseudo SOC having the wiring layer 54 formed in the above procedure, a solder bump layer is formed on the electrode pads by a printing technique. After an island pattern is formed with solder paste on the pads with the use of a printing plate, a reflow process is carried out to form ball-like bump layers (not shown).

As described above, a highly integrated semiconductor device that includes semiconductor chips such as a MEMS chip and a CMOS chip and passive devices such as resistors and capacitors effectively incorporated thereinto is designed to have a stacked structure in which layers containing different material constant modifiers are stacked as the adhesive layer for bonding the chips. With this structure, the warpage and the stress on the chips and the adhesive layer can be reduced, and the step portion at each interface between the chips and the adhesive layer can be made smaller. Thus, the mechanical strength of the semiconductor device can be secured. With this semiconductor device, a pseudo SOC having a wiring layer and solder bumps is formed, and is mounted onto a wiring board via the solder bumps.

Example 2

FIG. 12 illustrates a semiconductor device of Example 2 of the present invention. The semiconductor device 1A of this example is the same as the semiconductor device 1 of Example 1 illustrated in FIG. 1, except that an adhesive film 32c is provided on the surface (the back face) on the opposite side from the principal surfaces of the chips 10 and 20. The adhesive film 32c serves as a backing layer. The adhesive layer 30A that is provided between the semiconductor chip 10 and the MEMS chip 20, and bonds the semiconductor chip 10 and the MEMS chip 20 has a stacked structure formed with the adhesive film 32c, the adhesive film 32a, and the adhesive film 32b. The adhesive films 32a, 32b, and 32c contain at least two different material constant modifiers. The adhesive film 32b is a resin having a filler 36b added thereto. The filler 36b contains silica with a small mean particle size as the principal component. The adhesive film 32a is a resin having a filler 36a added thereto. The filler 36a has a larger mean particle size than the filler particles contained in the adhesive film 32b. The adhesive film 32c is a resin having a material constant modifier 36c added thereto. The material constant modifier 36c is different from the material constant modifiers 36a and 36b of the adhesive films 32a and 32b. Like the semiconductor device of Example 1 shown in FIG. 2, the semiconductor device 1A of this example is used as a pseudo SOC, after a flattening film 50 is formed on the principal surface side, via holes 52 continuing to the pads 14 and 24 are formed in the flattening film 50, and wires 54 are formed to fill the via holes 52 (FIG. 13). The wires 54 include a wire that electrically connects a pad 14 of the semiconductor chip 10 to a pad 24 of the MEMS chip 20 so as to electrically connect the semiconductor chip 10 to the MEMS chip 20, and a wire that connects the semiconductor chip 10 or the MEMS chip 20 to the outside.

In the semiconductor device 1A of this example, the adhesive film 32b is formed by adding 5.3 vol. % silica as the fine filler 36b with a mean particle size of 10 nm to the acid anhydrous epoxy resin 34. The adhesive film 32a is formed by adding 54 vol. % filler 36a with a regular particle size to the acid anhydrous epoxy resin 34. The adhesive film 32c is formed by adding 74 vol. % filler 36c with a regular particle size to the acid anhydrous epoxy resin 34. In the adhesive film 32b, the Young's modulus is 6700 MPa, the Poisson's ratio is 0.29, and the linear expansion coefficient is $24 \times 10^{-6}$. In the adhesive film 32a, the Young's modulus is 7200 MPa, the Poisson's ratio is 0.29, and the linear expansion coefficient is $23 \times 10^{-6}$. In the adhesive film 32c, the Young's modulus is 14000 MPa, the Poisson's ratio is 0.25, and the linear expansion coefficient is $10 \times 10^{-6}$.

Figure 17A:
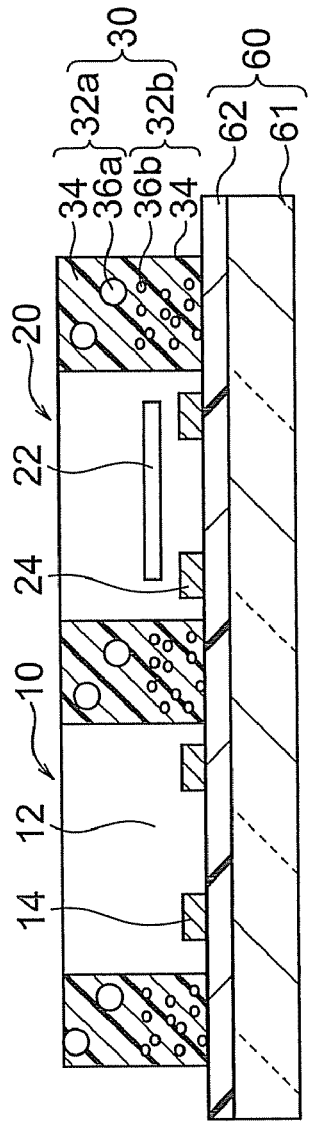
FIGS. 17A to 17C are cross-sectional views of a pseudo SOC including the semiconductor device of Example 2.
Figure 17B:
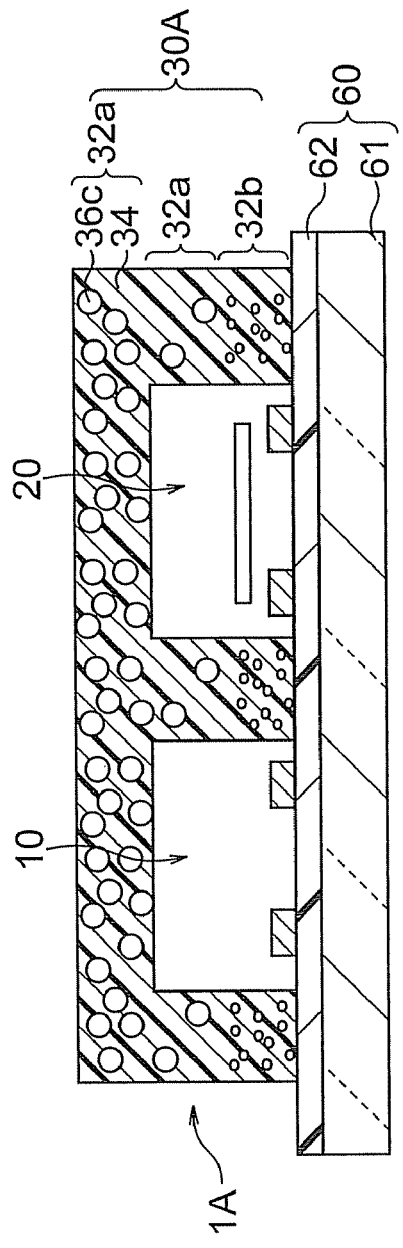
Figure 17C:
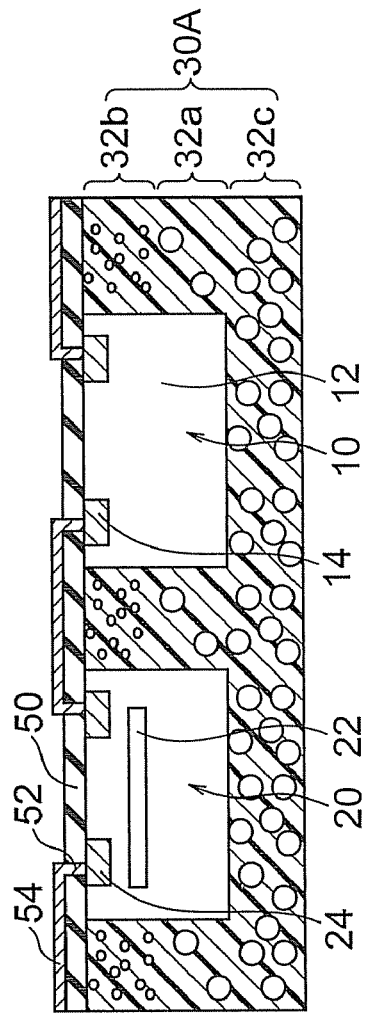

Referring now to FIGS. 17A through 17C, a method for manufacturing the semiconductor device of this example is described.

First, the same procedures as the procedures of Example 1 illustrated in FIGS. 14A through 15A are carried out. More specifically, a supporting substrate 60 having a 10-μm thick acrylic adhesive layer 62 formed on a 0.8-mm thick glass substrate 61 is prepared, as shown in FIG. 17A. The CMOS chip 10 and the MEMS chip 20 are mounted on the supporting substrate 60 at desired positions, and are temporarily bonded to the supporting substrate 60 with the adhesive layer 62. The space (the distance) between the MEMS chip 20 and the CMOS chip 10 is 1 mm. After that, a resin is prepared between the distance by adding 5.3 vol. % fine filler 36b containing silica with a mean particle size of 10 nm as the principal component to the acid anhydrous epoxy resin 34. The adhesive film 32b is then printed by a drop printing technique using a screen plate, so that the resin thickness after preliminary drying becomes 0.1 mm. The preliminary drying is performed at 65° C. for 30 minutes. A resin is then prepared by adding 54 vol. % filler 36a containing silica with a mean particle size of 10 μm as the principal component to the acid anhydrous epoxy resin 34, and the adhesive film 32a is printed on the adhesive film 32b by a printing technique using a screen plate. After that, preliminary calcination is performed at 100° C. for 30 minutes, to form a stacked structure of the two adhesive films containing different material constant modifiers (FIG. 17A).

A resin is then prepared by adding 74 vol. % filler 36c containing silica with a mean particle size of 10 μm as the principal component to the acid anhydrous epoxy resin 34 that is the same as that used in the adhesive film 32a, and the adhesive film 32c is printed by a printing technique using a screen plate. After that, preliminary calcination is performed at 100° C. for 30 minutes (FIG. 17B). The supporting substrate 60 is then removed, and calcination is performed at 180° C. for one hour. Thus, the semiconductor device 1A is produced.

Plasma processing on the principal surface side of the chips of the semiconductor device 1A is then performed for 10 seconds with the use of oxygen gas plasma formed by adding 5% $CF_4$ gas, so as to form minute concavities and convexities (not shown), with the largest height Rz of the outermost surface being 50 nm. After that, the wiring layer 54 is formed through the same procedures as those in Example 1, and a pseudo SOC is completed (FIG. 17C).

In this example, to increase the adhesive strength between the chips, an adhesive film having 5.3 vol. % superfine filler added thereto is used as the adhesive film 32b, and an adhesive film having 54 vol. % filler with a regular particle size added thereto is used as the adhesive film 32a. The adhesive strength of the adhesive film 32b is 0.97, and the adhesive strength of the adhesive film 32a is 0.76. Accordingly, both films maintain excellent adhesive strength. Further, to increase the rigidity of the entire semiconductor device 1A, an adhesive film having 74 vol. % filler with a regular particle size added thereto is used as the adhesive film 32c serving as the backing layer. With this arrangement, the warpage that forms a protrusion on the chip principal surface side at the time of cure shrinkage of the resins on the back faces of the chips can be made smaller.

Example 3

Figure 18:
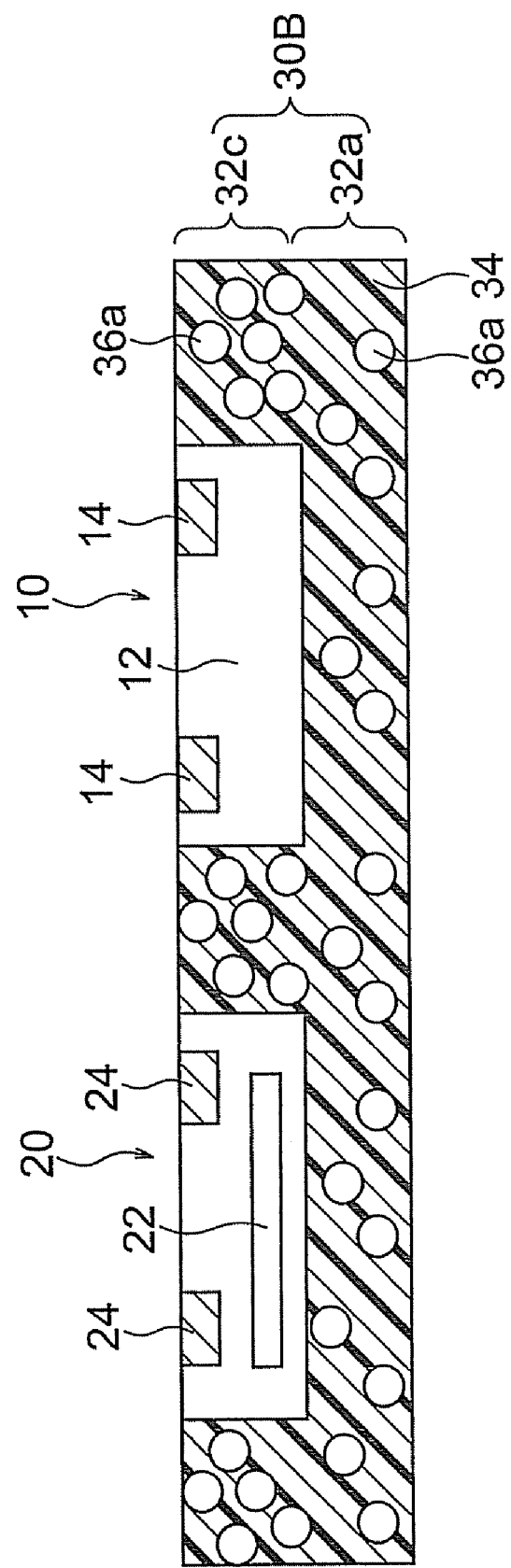
FIG. 18 is a cross-sectional view illustrating a method for manufacturing a semiconductor device of Example 3.

FIG. 18 shows a semiconductor device of Example 3 of the present invention. The semiconductor device 1B of this example includes a semiconductor chip 10, a MEMS chip 20, and an adhesive layer 30B that bonds the semiconductor chip 10 and the MEMS chip 20. The semiconductor chip 10 contains a semiconductor device 12 (such as a CMOS device). Pads 14 that are electrically connected to the semiconductor device 12 are provided in the upper face of the semiconductor chip 10. The MEMS chip 20 contains a MEMS device 22. Pads 24 that are electrically connected to the MEMS device 22 are provided in the upper face of the MEMS chip 20. The adhesive layer 30B has a stacked structure of adhesive films 32a and 32c that have different material constant modifiers contained in resin. The adhesive film 32a is provided on the surface (the back face) on the opposite side from the surface (the principal surface) on which the pads of the semiconductor chip (hereinafter also referred to as the CMOS chip) 10 and the MEMS chip 20 are formed.

In this example, an adhesive film formed by adding 54 vol. % silica as the filler 36a with a mean particle size of 5 μm to the acid anhydrous epoxy resin 34 is used as the adhesive film 32a. An adhesive film formed by adding 74 vol. % silica as the filler 36c with the same mean particle size as the filler in the adhesive film 32a to the acid anhydrous epoxy resin 34 is used as the adhesive film 32c. In the adhesive film 32a, the Young's modulus is 7200 MPa, the Poisson's ratio is 0.29, and the linear expansion coefficient is $23 \times 10^{-6}$. In the adhesive film 32c, the Young's modulus is 14000 MPa, the Poisson's ratio is 0.25, and the linear expansion coefficient is $10 \times 10^{-6}$.

Referring now to FIGS. 19A through 20C, a method for manufacturing the semiconductor device 1B of this example is described.

First, a stacked structure of a 0.8-mm thick base substrate 71 made of glass and an adhesive film 72 formed on the base substrate 71 is prepared as a supporting substrate 70. The adhesive film 72 has 15-μm thick acrylic adhesive layers 74 formed on both surfaces of a 0.15-mm thick polyethylene terephthalate (PET) film 73. The base substrate 71 is a glass mask that has a mask pattern 76 formed on its back face (the face on the opposite side from the face on which the adhesive film 72 is formed). The chip mounting positions are printed beforehand on the mask pattern 76. The adhesive film 72 is bonded to the glass mask 71. The CMOS chip 10 and the MEMS chip 20 are then mounted and temporarily fixed onto the adhesive layer 74 at the positions corresponding to the chip mounting positions (FIG. 19A).

Figure 20A:
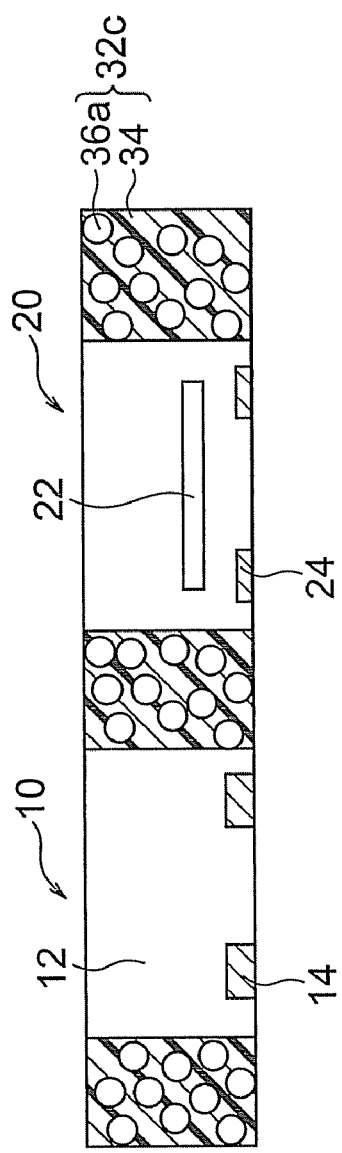
FIGS. 20A to 20C are cross-sectional views illustrating a method for manufacturing a semiconductor device of the Example 3.

A resin formed by adding 74 vol. % filler 36c containing silica with a mean particle size of 5 μm as the principal component to the acid anhydrous epoxy resin 34 is prepared as the adhesive film 32c. By a printing technique using a screen plate, the resin film (the adhesive film) 32c is printed to have such a resin thickness as to bury the chip having the largest height among the mounted chips. In this example, the resin film 32c is printed, so as to have a resin thickness of 0.6 mm after preliminary calcination. After the printing, the preliminary calcination is performed at 120° C. for 30 minutes. The supporting substrate 70 is then removed, and calcination is performed at 180° C. for one hour. Thus, a semiconductor module is formed (FIG. 20A).

Figure 20B:
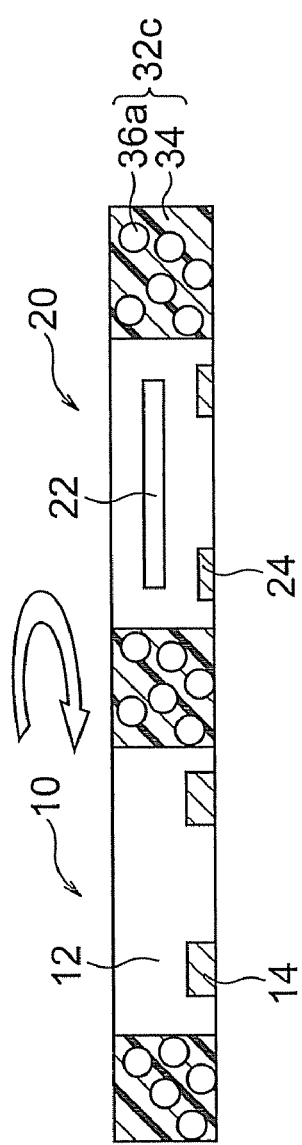
Figure 20C:
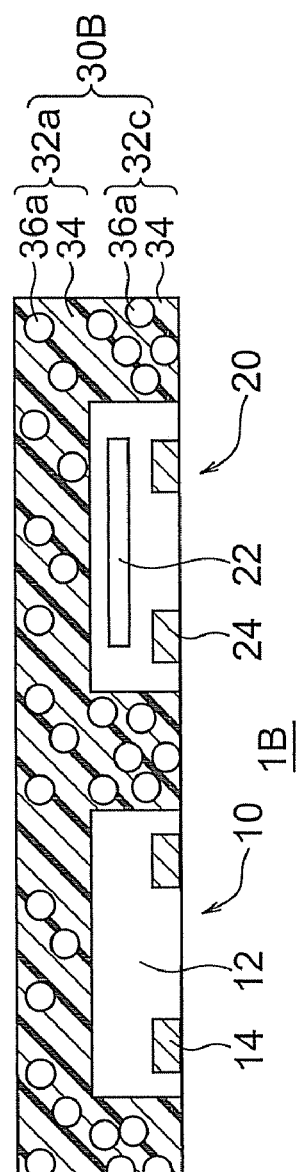

The back face of the semiconductor module is polished by a grinder, and the thickness of the semiconductor module is reduced to 0.2 mm, which is a thickness that does not affect the active region of the semiconductor chip (FIG. 20B). Further, the same resin as the resin of the adhesive film 32c is formed by adding 54 vol. % filler 36a that is the same as the filler dispersed in the adhesive film 32c and contains silica with a mean particle size 5 μm as the principal component, to the acid anhydrous epoxy resin 34. This resin is prepared as the adhesive film 32a to be formed on the back face of the semiconductor module. By a printing technique using a screen plate, the adhesive film 32a is printed, so as to have a resin thickness of 0.1 mm after calcination. Two calcination procedures are then carried out at 120° C. for 30 minutes and at 180° C. for one hour. The 0.3 mm semiconductor device 1B is thus produced (FIG. 20C).

Plasma processing on the principal surface side of the semiconductor device 1B is then performed for 30 seconds with the use of oxygen gas plasma formed by adding 3% $SF_6$ gas, so as to form minute concavities and convexities (not shown) in the surface of the adhesive layer 30B. Where $lr=\lambda c=5$ μm, and $\lambda s=20$ nm, the largest height Rz of the minute concavities and convexities formed in the outermost surface of the adhesive layer 30B through this procedure is 0.3 μm, according to the roughness curve of the cross section of the adhesive film 32c. After that, the flattening film and the wiring layer are formed through the same procedures as those in Example 1 and Example 2, and a pseudo SOC is completed (not shown).

In this example, to reduce the thickness of the semiconductor device, a resin having relatively high rigidity is used as an adhesive film in the adhesive layer 30 between the chips 10 and 20. With the formation of the adhesive film 32c, the stress and warpage caused in the chips and the adhesive films are reduced. Accordingly, high-precision polishing can be performed in the polishing procedure in the next stage. However, the adhesive strength is poor with the adhesive film 32c. To compensate for the poor adhesive strength, the adhesive film 32a as the backing layer is formed with a resin having relatively a high resin volume fraction and adhesive strength of 0.76. With this arrangement, a high-density semiconductor device that secures sufficiently high mechanical strength and has high reliability despite its thinness can be obtained as the semiconductor device 1B.

Example 4

Figure 21:
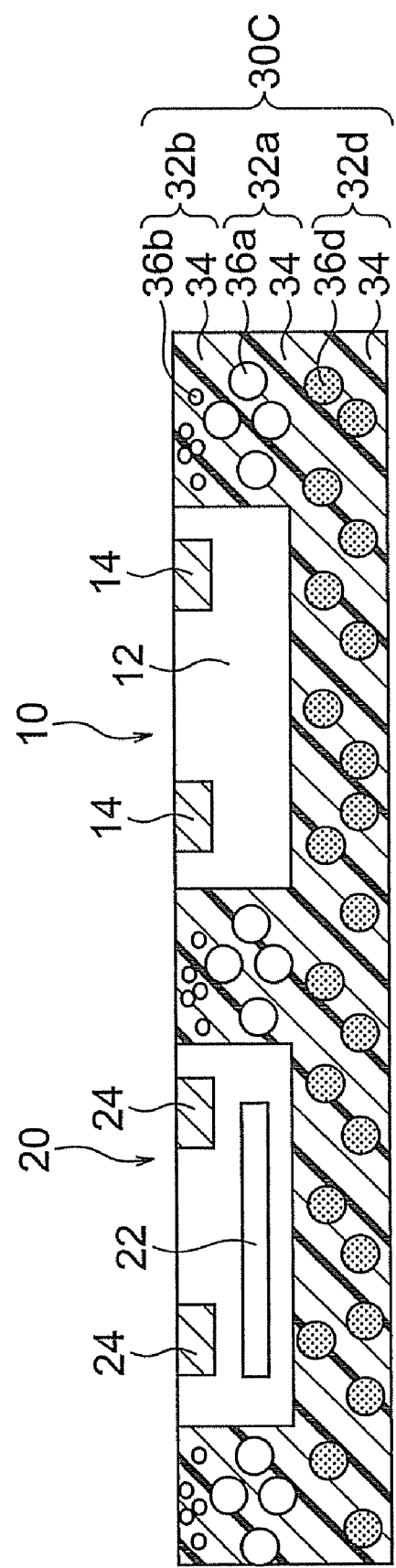
FIG. 21 is a cross-sectional view illustrating a method for manufacturing a semiconductor device of Example 4.

FIG. 21 shows a semiconductor device of Example 4 of the present invention. The semiconductor device 1C of this example includes a semiconductor chip 10, a MEMS chip 20, and an adhesive layer 30C that bonds the semiconductor chip 10 and the MEMS chip 20. The semiconductor chip 10 contains a semiconductor device 12 (such as a CMOS device). Pads 14 that are electrically connected to the semiconductor device 12 are provided in the upper face of the semiconductor chip 10. The MEMS chip 20 contains a MEMS device 22. Pads 24 that are electrically connected to the MEMS device 22 are provided in the upper face of the MEMS chip 20. The adhesive layer 30C has a stacked structure of adhesive films 32a, 32b, and 32d that have different material constant modifiers contained in resin. The adhesive film 32d is provided as the lowermost layer in the semiconductor device 1C, the adhesive film 32a is provided on the adhesive film 32d, and the adhesive film 32b is provided on the adhesive film 32a.

In this example, an adhesive film formed by adding 5.3 vol. % silica as the fine filler 36b with a mean particle size of 10 nm to the acid anhydrous epoxy resin 34 is used as the adhesive film 32b. An adhesive film formed by adding 74 vol. % filler 36a with a regular mean particle size of 5 μm to the epoxy resin 34 is used as the adhesive film 32a. An adhesive film formed by adding 67 vol. % carbon filler 36d with a mean particle size of 8 μm to the epoxy resin 34 is used as the adhesive film 32d. In the adhesive film 32b, the Young's modulus is 6700 MPa, the Poisson's ratio is 0.29, and the linear expansion coefficient is $24 \times 10^{-6}$. In the adhesive film 32a, the Young's modulus is 14000 MPa, the Poisson's ratio is 0.25, and the linear expansion coefficient is $10 \times 10^{-6}$. In the adhesive film 32d, the Young's modulus is 12000 MPa, the Poisson's ratio is 0.27, and the linear expansion coefficient is $14 \times 10^{-6}$. The thermal conductivity of the adhesive films 32a and 32b having the silica fillers added thereto is 0.19 W/(m·K), which is the same as the thermal conductivity of the simple resin. The thermal conductivity of the adhesive film 32d having the carbon filler added thereto is 0.37 W/(m·K), which is almost twice higher than the above.

Referring now to FIGS. 22A through 23B, a method for manufacturing the semiconductor device of this example is described.

First, a stacked structure of a 0.8-mm thick base substrate 71 made of glass and an adhesive film 72 formed on the base substrate 71 is prepared as a supporting substrate 70. The adhesive film 72 has 15-μm thick adhesive layers 74 formed on both surfaces of a 0.15-mm thick PET film 73.

Figure 22A:
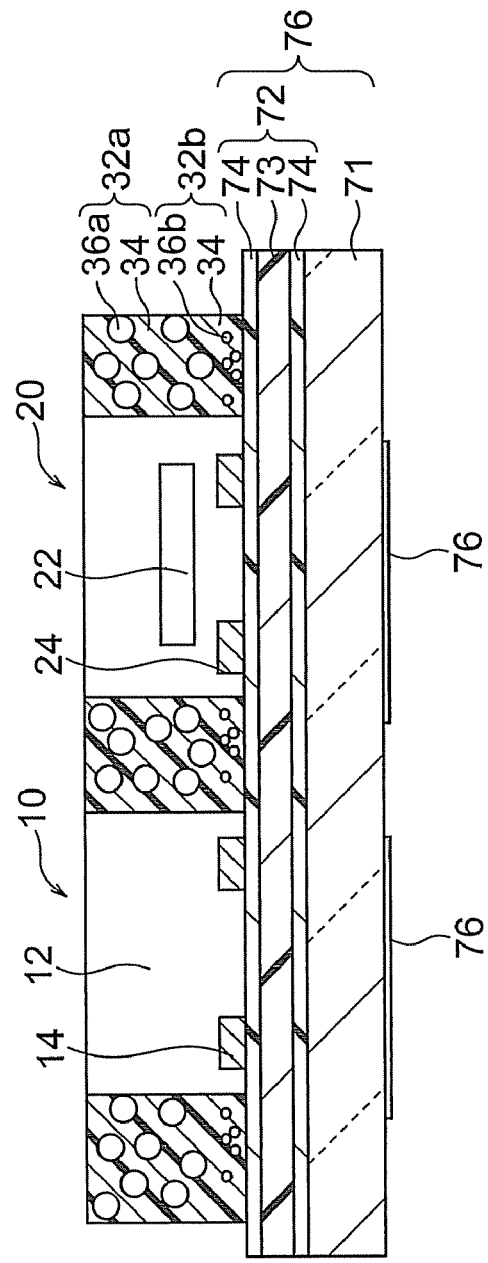
FIGS. 22A to 22C are cross-sectional views illustrating a method for manufacturing a semiconductor device of the Example 4.

The base substrate 71 is a glass mask that has a mask pattern 76 formed on its back face (the face on the opposite side from the face on which the adhesive film 72 is formed). The chip mounting positions are printed beforehand on the mask pattern 76. The adhesive film 72 is bonded to the glass mask 71. The CMOS chip 10 and the MEMS chip 20 are mounted and temporarily fixed onto the adhesive layer 74 at the positions corresponding to the chip mounting positions (FIG. 22A). As in Example 1, a resin formed by adding 5.3 vol. % fine filler 36b containing silica with a mean particle size of 10 nm as the principal component to the acid anhydrous epoxy resin 34 is prepared as the adhesive film 32b. The adhesive film 32b is formed by a dispenser, so as to have a resin thickness of 0.05 mm after preliminary drying. The preliminary drying is then performed at 65° C. for 30 minutes. After that, a resin film to be the adhesive film 32a is formed by adding 74 vol. % filler 36a containing silica with a mean particle size of 5 μm as the principal component to the same epoxy resin 34 as that used in the adhesive film 32b. By a printing technique using a screen plate, the resin film is printed on the adhesive film 32b. Preliminary calcination is then performed at 100° C. for 30 minutes, to complete the adhesive film 32a (FIG. 22A).

Figure 22B:
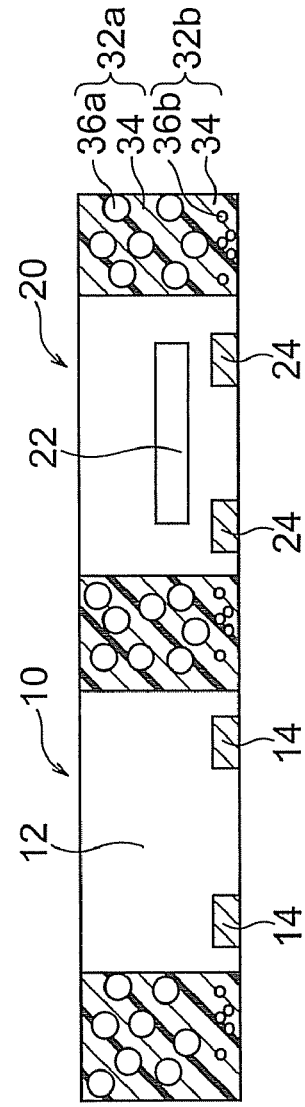
Figure 22C:
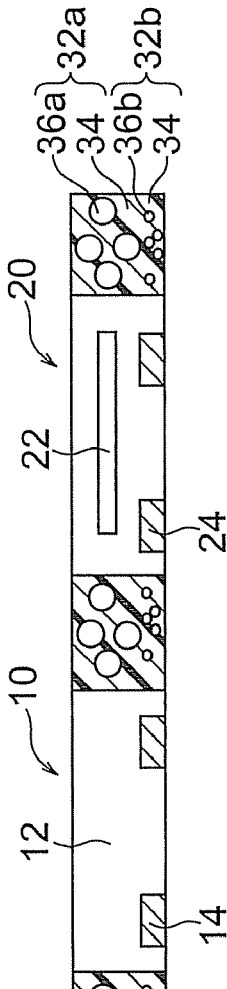

The supporting substrate 70 is then removed, and calcination is performed at 180° C. for one hour. The semiconductor module is thus formed (FIG. 22B). The back face (the face from which the supporting substrate 70 is removed) of the semiconductor module is polished by a grinder, so that the thickness of the semiconductor module is reduced to 0.2 mm (FIG. 22C).

Figure 23A:
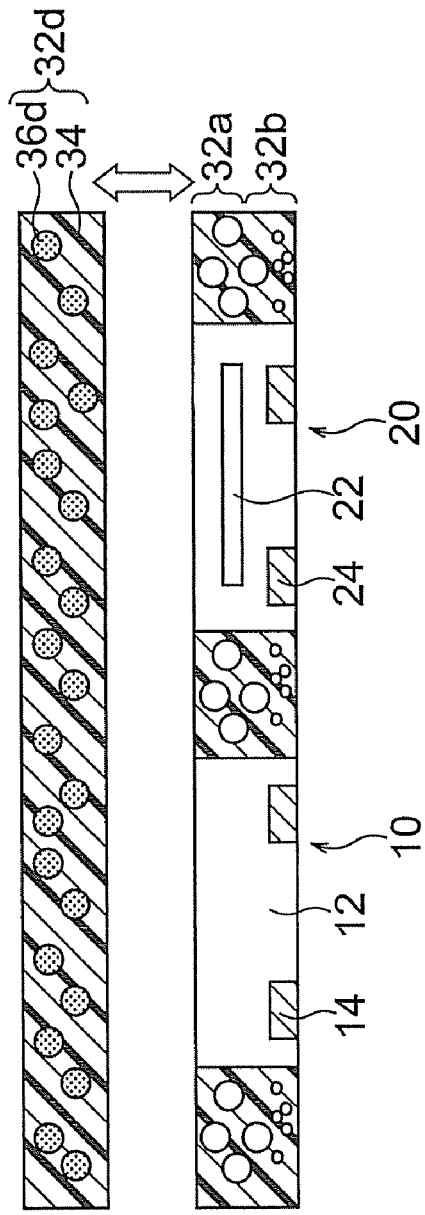
FIGS. 23A and 23B are cross-sectional views illustrating a method for manufacturing a semiconductor device of the Example 4.
Figure 23B:
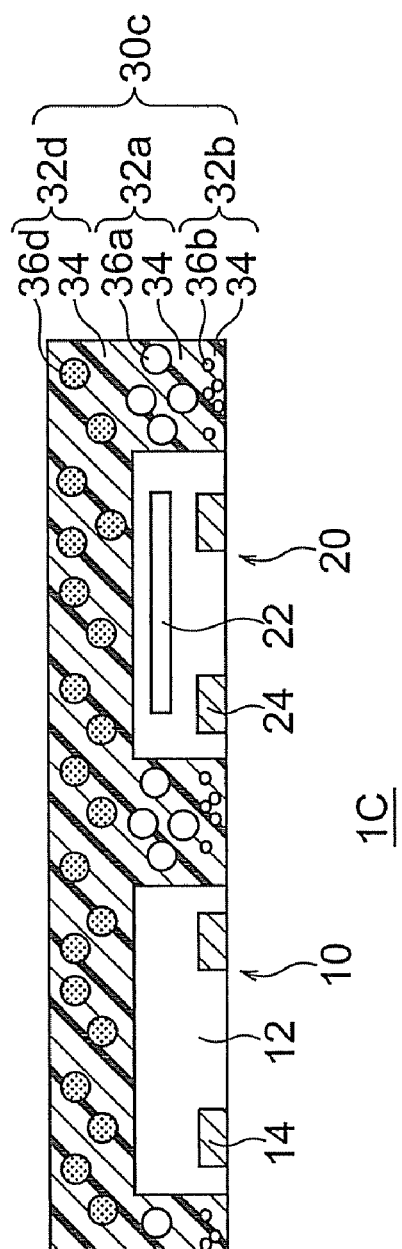

The carbon filler-containing resin sheet 32d is prepared by adding 67 vol. % carbon filler 36d having high thermal conductivity and a mean particle size of 8 μm to the acid anhydrous epoxy resin 34 that is the same as that used in the adhesive films 32a and 32b. The carbon filler-containing resin sheet 32d is molded into a sheet in a partially cured state or the so-called B stage. The thickness of the sheet 32d at this point is 0.1 mm. The sheet 32d is bonded to the polished back face of the semiconductor module, and the adhesive film 32d as the backing layer is completed (FIGS. 23A and 23B). After that, final calcination is performed at 180° C. for one hour. Thus, the 0.3-mm thick semiconductor device 1C that secures mechanical strength and has higher radiation performance on the chip back side is obtained (FIG. 23B).

Example 5

Figure 24:
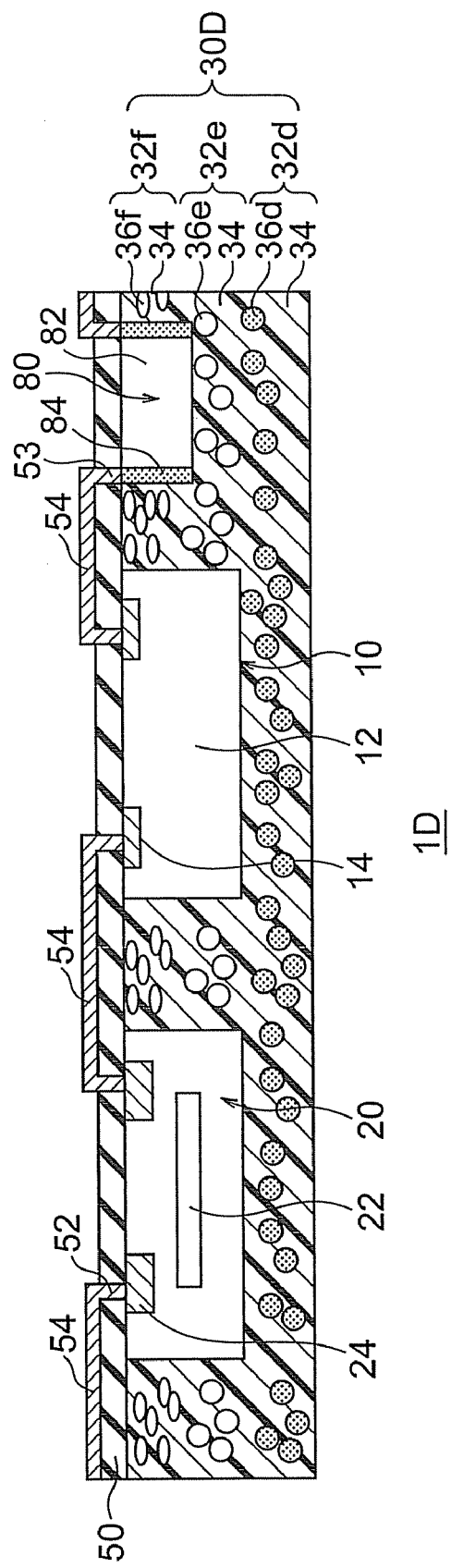
FIG. 24 is a cross-sectional view illustrating a method for manufacturing a semiconductor device of Example 5.

FIG. 24 shows a semiconductor device of Example 5 of the present invention. The semiconductor device 1D of this example includes a semiconductor chip 10, a MEMS chip 20, a passive device chip 80, and an adhesive layer 30D that bonds the chips 10, 20, and 80. The semiconductor chip 10 contains a semiconductor device 12 (such as a CMOS device). Pads 14 that are electrically connected to the semiconductor device 12 are provided in the upper face of the semiconductor chip 10. The MEMS chip 20 contains a MEMS device 22. Pads 24 that are electrically connected to the MEMS device 22 are provided in the upper face of the MEMS chip 20. The passive device chip 80 contains a passive device 82, and terminals 84 that are electrically connected to the passive device 82 are provided on both side faces of the passive device chip 80. The adhesive layer 30D has a stacked structure of adhesive films 32d, 32e, and 32f that have different material constant modifiers contained in resin. The adhesive film 32d is provided as the lowermost layer in the semiconductor device 1D, the adhesive film 32e is provided on the adhesive film 32d, and the adhesive film 32f is provided on the adhesive film 32e. In this example, the adhesive film 32d exists under the semiconductor chip 10 and the MEMS chip 20, and the adhesive films 32d and 32e exist under the passive device chip 80.

In the semiconductor device 1D of this example, a flattening film 50 is formed to cover the principal surfaces of the chips 10, 20, and 80. Vias 52 and 53 that are electrically connected to the pads 14 and 24 and the terminals 84 are formed in the flattening film 50. Wires 54 that connect to the vias 52 and 53 are further formed. The semiconductor chip 10, the MEMS chip 20, and the passive device chip 80 are electrically connected to one another by the vias 52 and 53 and the wires 54.

In this example, an adhesive film formed by adding 5 vol. % Ni—Zn ferrite fine particles 36f with a mean particle size of 200 nm to an acid anhydrous epoxy resin 34 is used as the adhesive film 32f. An adhesive film formed by adding 74 vol. % aluminum nitride filler 36e with a mean particle size of 5 μm to the acid anhydrous epoxy resin 34 is used as the adhesive film 32e. An adhesive film formed by adding 67 vol. % carbon filler 36d with a mean particle size of 8 μm to the acid anhydrous epoxy resin 34 is used as the adhesive film 32d. In the adhesive film 32f, the Young's modulus is 6400 MPa, the Poisson's ratio is 0.29, and the linear expansion coefficient is $24 \times 10^{-6}$. In the adhesive film 32e, the Young's modulus is 14000 MPa, the Poisson's ratio is 0.25, and the linear expansion coefficient is $10 \times 10^{-6}$. In the adhesive film 32d, the Young's modulus is 12000 MPa, the Poisson's ratio is 0.27, and the linear expansion coefficient is $14 \times 10^{-6}$. The thermal conductivity of the adhesive film 32f having the Ni—Zn ferrite fine particles 36f added thereto is the same as that of the simple resin, as the additive amount is very small. The thermal conductivity of the adhesive films 32e having the aluminum nitride filler 36e added thereto is 0.29 W/(m·K), which is almost 1.5 times higher than the above. The thermal conductivity of the adhesive film 32d having the carbon filler 36d added thereto is 0.37 W/(m·K), which is almost twice higher than the above.

Next, a method for manufacturing the semiconductor device of this example is described.

As in Example 4, a stacked structure of a 0.8-mm thick glass mask and an adhesive film is prepared as a supporting substrate. The adhesive film has 15-μm thick adhesive layers formed on both surfaces of a 0.15-mm thick PET film. The MEMS chip 20, the CMOS chip 10, and the passive device chip 80 are mounted on the supporting substrate having the adhesive film bonded to the base substrate. As in Example 2 or 4, a resin formed by adding 5 vol. % Ni—Zn ferrite fine particles 36f with a mean particle size of 200 nm to the acid anhydrous epoxy resin 34 is prepared as the adhesive film 32f. The adhesive film 32f is formed by a dispenser, so as to have a resin thickness of 0.05 mm after preliminary drying. The preliminary drying is then performed at 65° C. for 30 minutes. A resin film to be the adhesive film 32e is formed by adding 74 vol. % filler 36e containing aluminum nitride with a mean particle size of 5 μm as the principal component to the same epoxy resin 34 as that used in the adhesive film 32f. The aluminum nitride filler 36e has higher thermal conductivity than silica. By a printing technique using a screen plate, the resin film is printed on the adhesive film 32f. Preliminary calcination is then performed at 100° C. for 30 minutes, to complete the adhesive film 32e. The supporting substrate is then removed, and calcination is performed at 180° C. for one hour. The back face of the semiconductor module is then polished by a grinder, so that the thickness of the semiconductor module is reduced to 0.2 mm.

A carbon filler-containing resin sheet (the sheet thickness being 0.1 mm) is prepared by adding 67 vol. % carbon filler 36d having high thermal conductivity and a mean particle size of 8 μm to the acid anhydrous epoxy resin 34 that is the same as that used in the other adhesive layers, and molding it into a partially cured state. This sheet is bonded to the polished back face of the semiconductor module, and the adhesive film 32d as the backing layer is completed. After that, final calcination is performed at 180° C. for one hour. Thus, the semiconductor device 1D as thin as 0.3 mm is obtained.

Plasma processing on the principal surface side of the semiconductor device 1D is then performed for 10 seconds with the use of oxygen gas plasma formed by adding 3% $SF_6$ gas, so as to form minute concavities and convexities in the outermost surface of the adhesive film 32f. Where Ir=λc=1 μm, and λs=10 nm, the largest height Rz of the minute concavities and convexities in the outermost surface obtained through this procedure is 0.1 μm, according to the roughness curve of the cross section of the adhesive film 32f. After that, the flattening film 50, the vias 52 and 53, and the wires 54 are formed through the same procedures as those in Example 1 or 2, and a pseudo SOC is completed (not shown).

In this example, a pseudo SOC is obtained with the use of a semiconductor device that secures mechanical strength and has higher radiation performance on the back face side of the chips. The Ni—Zn ferrite fine particles dispersed on the principal surface side of the chips have excellent electric insulation properties, and secures the reliability of the wire layer formed thereon. The Ni—Zn ferrite fine particles are also effective in reducing noise in the high-frequency region.

In the above examples, epoxy resin is used as the burying resin material. However, the same effects as above can be achieved with a highly-adhesive resin having excellent electric properties, such as polyimide resin, silicon resin, or crystal liquid polymer. Also, in the above examples, the films forming the adhesive layer are made of the same resin material, but it is possible to use different resins, if necessary. In such a case, it is essential to optimize the material, particle size, additive amount, and the likes of each filler, so that the material constants such as the Young's modulus, Poisson's ratio, and linear expansion coefficient of the resin layer fall in desired ranges.

In the above examples, silica, carbon particles, Ni—Zn ferrite fine particles, and aluminum nitride are used as the filler materials. Other than those materials, an organic resin such as polystyrene resin particles, particles of a metal such as copper, aluminum, or silver, fine particles of an inorganic material such as boron nitride or alumina, or carbon nanotube can be used to achieve the same effects as above, in accordance with the required characteristics of the semiconductor device such as heat resistance, insulation property and radiation performance. In a case where those materials are added, it is essential to perform optimization so that the material constants such as the Young's modulus, Poisson's ratio, and linear expansion coefficient of the resin layer fall in the desired ranges in accordance with the particle size range of the fine particles.

In the above examples, minute concavities and convexities are formed in the outermost surface of each module. In a case where the particle size of the fine particles added to the resin on the outermost surface side is 1 μm or less, the desirable range of the largest height Rz obtained where Ir=λc=1 μm, and λs=10 nm is 20 nm≦Rz≦500 nm, according to the roughness curve of a cross section of the resin film. If the largest height Rz of concavities and convexities is less than 20 nm, a sufficient anchor effect cannot be obtained, and firm adhesion between the module and the flattening film cannot be secured. If the largest height Rz is more than 500 nm, the coatability of the flattening film becomes lower, and the wires are easily cut off at the step portions. In a case where the particle size of the fine particles is in the range of 5 μm to 50 μm, the desirable range of the largest height Rz obtained where Ir=λc=5 μm, and λs=20 nm is 30 nm≦Rz≦1 μm, according to the roughness curve of a cross section of the resin layer. If the largest height Rz of concavities and convexities is less than 30 nm, a sufficient anchor effect cannot be obtained, and firm adhesion between the module and the flattening film cannot be secured. If the largest height Rz is more than 1 μm, the coatability of the flattening film becomes lower, and the wires are easily cut off at the step portions. It is necessary to optimize the material and film thickness of the flattening film, and the material, film thickness, and line width of the wires, in accordance with the particle size range of the fine particles on the surface side.

Example 6

Figure 25:
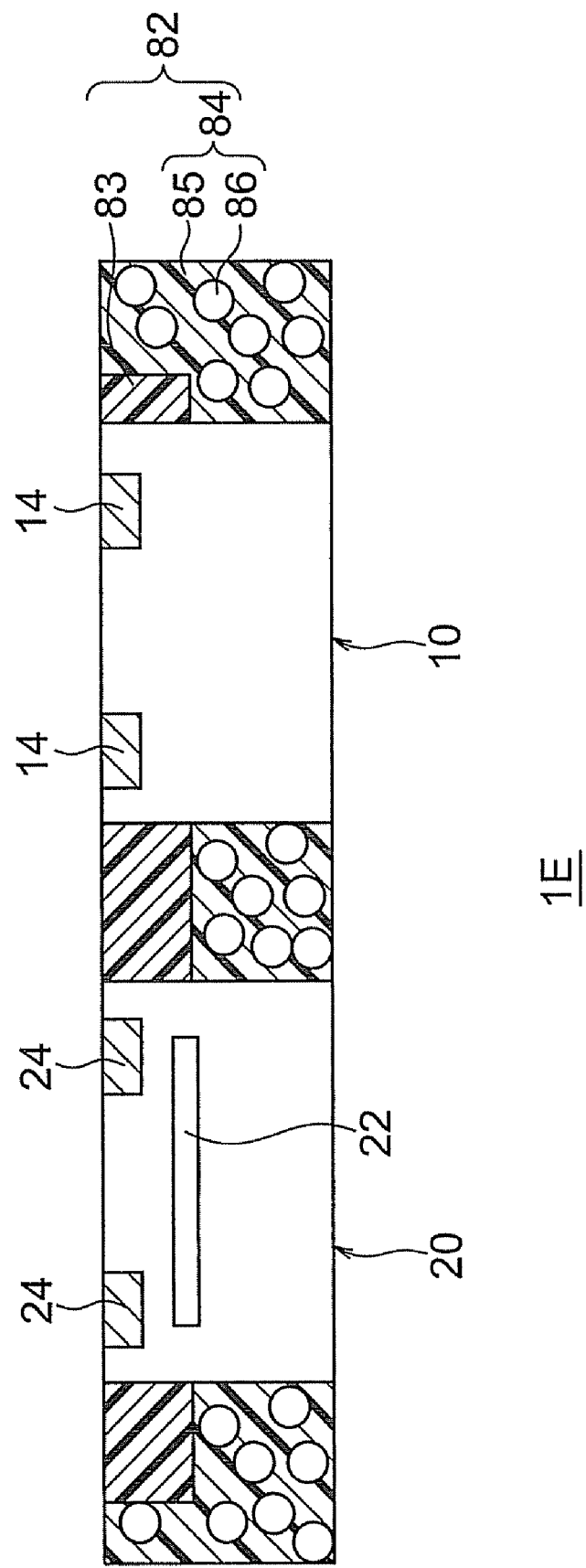
FIG. 25 is a cross-sectional view illustrating a method for manufacturing a semiconductor device of Example 6.
Figure 26:
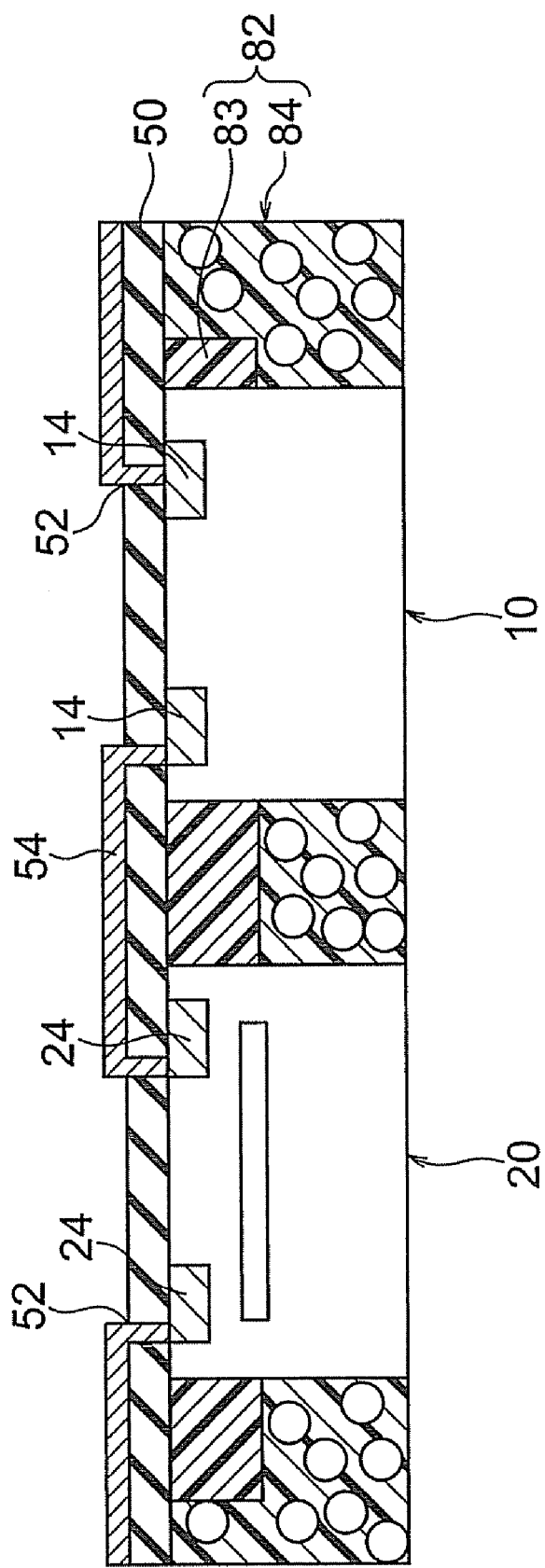
FIG. 26 is a cross-sectional view of a pseudo SOC including the semiconductor device of Example 6.

FIG. 25 shows a semiconductor device of Example 6 of the present invention. The semiconductor device 1E of this example includes a semiconductor chip 10, a MEMS chip 20, and an adhesive layer 82 that bonds the semiconductor chip 10 and the MEMS chip 20. The semiconductor chip 10 contains a semiconductor device (such as a CMOS device). Pads 14 that are electrically connected to the semiconductor device are provided in the upper face of the semiconductor chip 10. The MEMS chip 20 contains a MEMS device 22. Pads 24 that are electrically connected to the MEMS device 22 are provided in the upper face of the MEMS chip 20. The adhesive layer 82 has a stacked structure of a first adhesive film 83 and a second adhesive film 84 that have different material constant modifiers contained in resin. The first adhesive film 83 is formed by performing preliminary calcination on a patterned photosensitive resin, and is designed to surround the vicinity areas of the chips 10 and 20. The second adhesive film 84 has a filler 86 added thereto. The filler 86 contains silica with a mean particle size of 10 μm as the principal component. FIG. 26 shows a pseudo SOC having a wiring layer formed on the semiconductor device 1E of this example.

In the semiconductor device 1E of this example, desired patterning can be performed on the first adhesive film 83 that is a photosensitive resin formed with a copolymer resin of epoxy resin and phenol resin. For example, the first adhesive film 83 may be INTERVIA™ PHOTODIELECTRIC resin (manufactured by Rohm and Haas Electronic Materials K.K.), which is of a negative permanent resist type available in the market. In this resin after calcination, the Young's modulus is 4000 MPa, the Poisson's ratio is 0.45, and the linear expansion coefficient is $62 \times 10^{-6}$. The second adhesive film 84 is formed by adding 74 vol. % silica filler 86 with a mean particle size of 10 μm to an acid anhydrous epoxy resin 85. In the second adhesive film 84, the Young's modulus is 14000 MPa, the Poisson's ratio is 0.25, and the linear expansion coefficient is $10 \times 10^{-6}$.

In the semiconductor device 1E of this example having the above structure, a flattening film 50 is further formed on the principal surface of the chips, as shown in FIG. 26. Via holes 52 continuing to the pads 14 and 24 are formed in the flattening film 50, and wires 54 are formed to fill the via holes 52. In this manner, the pseudo SOC is completed. In this example, the flattening film 50 is made of the same photosensitive resin as the first adhesive layer 83.

Referring now to FIGS. 28A through 29B, a method for manufacturing the semiconductor device of this example is described. First, a supporting substrate 100 having a stacked structure of a base substrate 101 made of glass and an adhesive film 102 formed on the base substrate 101 is prepared, as shown in FIG. 28A. The adhesive film 102 has 10-μm thick acrylic adhesive layers 104 formed on both faces of a 0.1-mm thick PET film. The base substrate 101 is a glass mask that has a mask pattern 106 formed on its back face, and the chip mounting positions are printed beforehand on the mask pattern 106. The adhesive film 102 is bonded to the glass mask 101. The CMOS chip 10 and the MEMS chip 20 are then mounted and temporarily fixed onto the adhesive layer 103 at the positions corresponding to the chip mounting positions by the adhesive layer 103. The distance between the chips at this point is 0.1 mm.

As shown in FIG. 28B, the INTERVIA™ PHOTODIELECTRIC resin 107 is formed into a film by a spin coat technique, and pre-cure is performed at 80° C. The resin film 107 is then positioned to a photomask 110, and exposure is carried out. A mask pattern 112 is formed on the photomask 110. After the development with a special-purpose liquid developer, preliminary calcination at 120° C. is performed on the resin film 107, so that the resin film has a film thickness 20 μm after the calcination. In this manner, the first adhesive film 83 surrounding the vicinity regions of the chips 10 and 20 is formed (FIG. 29A). After the formation of the first adhesive film 83, the photomask 110 is removed.

As shown in FIG. 29B, the second adhesive film 84 is prepared by adding 74 vol. % filler 86 containing silica with a mean particle size of 10 μm as the principal component to the acid anhydrous epoxy resin 85. The resin prepared as the second adhesive film 84 is formed on the first adhesive film 83 by a printing technique using a screen plate. After that, preliminary calcination is performed at 100° C. for 30 minutes, to complete the second adhesive film 84. The film thickness of the second adhesive film 84 after the calcination is 0.55 mm, which is almost the same as the chip thickness. After the supporting substrate 100 is removed, calcination is performed at 180° C. for one hour. Thus, the semiconductor device 1E is produced (FIG. 25).

An INTERVIA™ PHOTODIELECTRIC resin 103 is then formed into a film on the principal surface side of the semiconductor device 1E by a spin coat technique. After pre-cure is performed, patterning is performed on the resin film, with a mask being used. After development and precure are further performed, a flattening film 50 having openings corresponding to the pads is formed (not shown). Vias 52 that fill the openings are formed by a plating technique. A wiring material film is deposited, and patterning is performed on the wiring material film, so as to form a wiring pattern 54 (FIG. 26).

Since the first adhesive film 83 and the flattening film 50 are made of the same material by the manufacturing method in this example, the adhesive strength at each interface is very high. Also, as the first adhesive film 83 is made of a photosensitive resin, the adhesive strength between the resin and the chips is increased by selectively providing the first adhesive film 83 in the regions corresponding to the positions at which the pad connecting wires are to be formed. Thus, the module reliability can be made higher.

Figure 27:
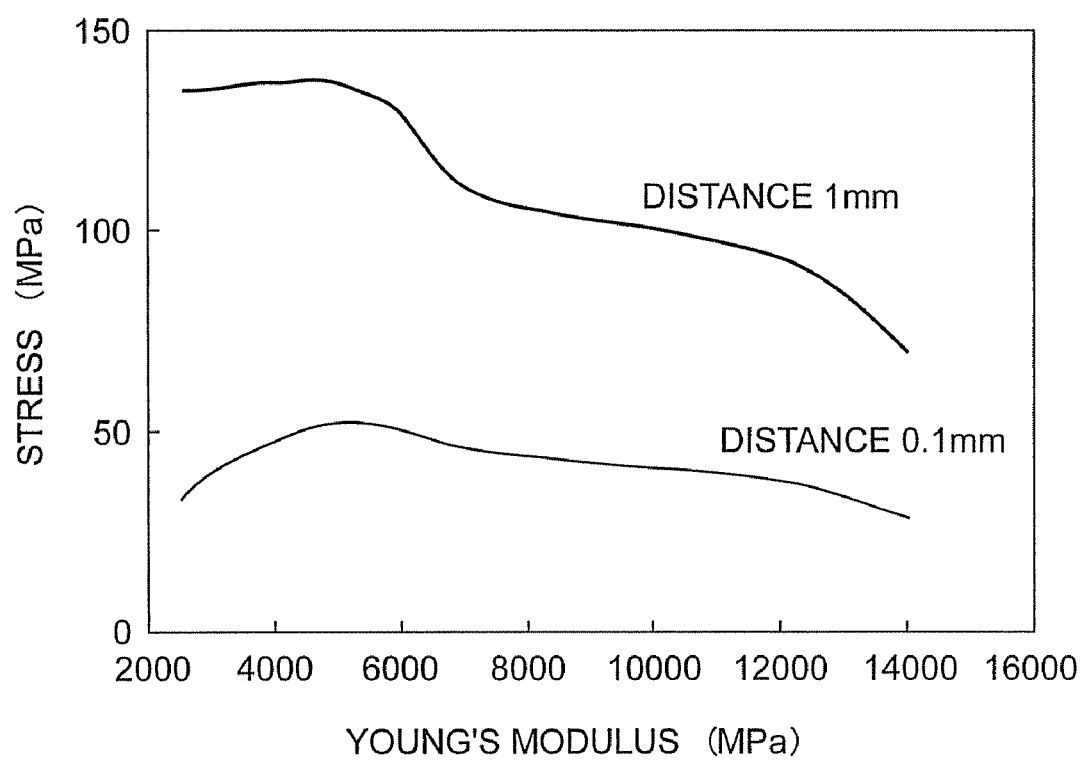
FIG. 27 shows the simulation results indicating the relationship between the Young's modulus of the resin and the stress on the semiconductor chip.

As shown in FIG. 27, where the distance between the chips is narrowed, the stress on the chip end portions in the module becomes lower. With the photosensitive resin used in this example, the stress on the chip end portions can be made sufficiently lower. Since the adhesive film of the module is made of epoxy resin as the second adhesive film, the stress on the chips can be reduced. FIG. 27 shows the results of simulations performed to determine the relationship between the Young's modulus and the stress in two samples each having a chip size of 3 mm square, a chip thickness of 0.55 mm, and a resin thickness of 0.55 mm, but having different distances of 1 mm and 0.1 mm between the chips.

In the above examples, photosensitive epoxy resin and photosensitive epoxy-phenol copolymer resin are used as the flattening film. However, a burying resin material that exhibits excellent fine processability for via holes and the likes, and has excellent flatness and electric properties, and a highly-adhesive resin material, such as photosensitive polyimide resin and photosensitive benzocyclobutene resin, can be used to achieve the same effects as above.

As described so far, in accordance with any one of the embodiments of the present invention, the adhesive layer has a structure in which films containing two or more different material constant modifiers are stacked. With this structure, the stress and warpage caused in the chips and the substrate can be restricted, while the adhesive strength and mechanical strength of the entire adhesive layer is maintained. Accordingly, a pseudo SOC that restrains stress and warpage while securing mechanical strength can be realized with the use of a semiconductor device that is formed only with chips and an adhesive layer provided between the chips. To further increase the mechanical strength, an adhesive film serving as a backing layer may be provided. With this arrangement, sufficient mechanical strength can be secured even in a semiconductor device that has a small thickness with a polished back face. Accordingly, in a pseudo SOC formed by integrating different kinds of chips, sufficient adhesive strength can be secured between the chips, and the mechanical strength of the device can be maintained. At the same time, the stress and warpage caused in the chips can be reduced, and higher device integration and a smaller thickness can be achieved.

Also, the material and mean particle size of the filler in each film of the adhesive layer are selected in accordance with the required characteristics of a semiconductor device, such as heat resistance, insulation properties, and radiation performance, so that the improvement of the property of the semiconductor device can be realized.

As described so far, in accordance with the present invention, the advantages of SOC and the advantages of SIP can be achieved at the same time. Thus, a device more sophisticated than ever can be realized at low costs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
a first chip including a MEMS device and a first pad formed on an upper face of the MEMS device, the first pad being electrically connected to the MEMS device;
a second chip including a semiconductor device and a second pad formed on an upper face of the semiconductor device, the second pad being electrically connected to the semiconductor device; and
an adhesive portion having a stacked structure, and bonding a side face of the first chip and a side face of the second chip, the stacked structure including a first adhesive film formed by adding a first material constant modifier to a first resin, and a second adhesive film formed by adding a second material constant modifier to a second resin,
wherein:
the first resin and the second resin are the same material; and
the first material constant modifier has a different mean particle size from a mean particle size of the second material constant modifier.

2. A device comprising:
a first chip including a MEMS device and a first pad formed on an upper face of the MEMS device, the first pad being electrically connected to the MEMS device;
a second chip including a semiconductor device and a second pad formed on an upper face of the semiconductor device, the second pad being electrically connected to the semiconductor device; and
an adhesive portion having a stacked structure, and bonding a side face of the first chip and a side face of the second chip, the stacked structure including a first adhesive film formed by adding a first material constant modifier to a first resin, and a second adhesive film formed by adding a second material constant modifier to a second resin,
wherein the first adhesive film is formed to cover a surface on the opposite side from upper faces of the first chip and the second chip, and
wherein:
the first resin and the second resin are the same material;
the first material constant modifier and the second material constant modifier have the same mean particle size; and
an additive amount of the first material constant modifier added to the first adhesive film differs from an additive amount of the second material constant modifier added to the second adhesive film.

3. A device comprising:
a first chip including a MEMS device and a first pad formed on an upper face of the MEMS device, the first pad being electrically connected to the MEMS device;
a second chip including a semiconductor device and a second pad formed on an upper face of the semiconductor device, the second pad being electrically connected to the semiconductor device; and
an adhesive portion having a stacked structure, and bonding a side face of the first chip and a side face of the second chip, the stacked structure including a first adhesive film formed by adding a first material constant modifier to a first resin, a second adhesive film formed by adding a second material constant modifier to a second resin, and a third adhesive file formed by adding a third material constant modifier to a third resin to cover a surface on the opposite side from upper faces of the first chip and the second chip,
wherein:
the first, second, and third resins are the same material;
the second material constant modifier and the third material constant modifier have the same mean particle size;
the first material constant modifier has a different mean particle size from the mean particle size of the second and third material constant modifiers; and
an additive amount of the second material constant modifier added to the second adhesive film differs from an additive amount of the third material constant modifier added to the third adhesive film.

4. The device according to claim 1, further comprising:
an insulating film that cover upper faces of the first chip and the second chip and an upper face of the adhesive portion, and has contact holes continuing to the first pad and the second pad; and
a wire that is formed on the insulating film, and is connected to the first and second pads.

5. The device according to claim 2, further comprising:
an insulating film that cover upper faces of the first chip and the second chip and an upper face of the adhesive portion, and has contact holes containing to the first pad and the second pad; and
a wire that is formed on the insulating film, and is connected to the first and second pads.

6. The device according to claim 3, further comprising:
an insulating film that cover upper faces of the first chip and the second chip and an upper face of the adhesive portion, and has contact holes continuing to the first pad and the second pad; and
a wire that is formed on the insulating film, and is connected to the first and second pads.

* * * * *